(12) United States Patent
Kim et al.

(10) Patent No.: US 9,324,458 B2
(45) Date of Patent: Apr. 26, 2016

(54) METHOD AND CONTROLLER FOR RECEIVING AND OUTPUTTING COMMANDS AND ADDRESSES USING A QUEUE

(71) Applicant: Samsung Electronics Co., Ltd.

(72) Inventors: Hyun-joong Kim, Yongin-si (KR); Tae-young Oh, Seoul (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 176 days.

(21) Appl. No.: 14/096,824

(22) Filed: Dec. 4, 2013

(65) Prior Publication Data

US 2014/0157045 A1 Jun. 5, 2014

(30) Foreign Application Priority Data

Dec. 4, 2012 (KR) .......................... 10-2012-0139827

(51) Int. Cl.
*G06F 11/00* (2006.01)
*G11C 29/00* (2006.01)
*G06F 11/07* (2006.01)

(52) U.S. Cl.
CPC .............. *G11C 29/76* (2013.01); *G06F 11/073* (2013.01)

(58) Field of Classification Search
CPC ... G06F 11/073; G06F 11/1666; G11C 29/72; G11C 29/76; G11C 29/88; G11C 29/886
See application file for complete search history.

(56) References Cited

U.S. PATENT DOCUMENTS

| | | | |
|---|---|---|---|
| 5,958,065 A * | 9/1999 | Klein | 714/5.1 |
| 6,993,679 B2 * | 1/2006 | George | 714/6.13 |
| 7,035,142 B2 * | 4/2006 | Khouri et al. | 365/185.09 |
| 7,221,603 B2 | 5/2007 | Roohparvar | |
| 7,602,642 B2 | 10/2009 | Choi | |
| 7,770,077 B2 * | 8/2010 | Arimilli et al. | 714/710 |
| 7,890,820 B2 | 2/2011 | Peng | |
| 7,916,540 B2 | 3/2011 | Byeon | |
| 7,984,329 B2 * | 7/2011 | Lastras-Montano et al. | 714/6.2 |
| 8,208,325 B2 | 6/2012 | Urakawa et al. | |
| 8,214,579 B2 | 7/2012 | Mitsunaga et al. | |
| 8,254,191 B2 * | 8/2012 | Jeddeloh et al. | 365/200 |
| 8,327,065 B2 | 12/2012 | Yano et al. | |
| 8,363,482 B2 | 1/2013 | Kim et al. | |
| 2011/0016352 A1 | 1/2011 | Ong et al. | |
| 2012/0072768 A1 * | 3/2012 | Morris et al. | 714/6.2 |
| 2012/0106224 A1 | 5/2012 | Lee | |
| 2012/0159280 A1 | 6/2012 | Yang et al. | |

FOREIGN PATENT DOCUMENTS

| | | |
|---|---|---|
| JP | 2010-192074 | 9/2010 |
| KR | 0845526 | 4/2008 |

(Continued)

*Primary Examiner* — Joseph Kudirka
(74) *Attorney, Agent, or Firm* — Muir Patent Law, PLLC

(57) ABSTRACT

Provided are a memory controller, a memory system including the memory controller, and an operating method performed by the memory controller. The operating method includes operations of queuing a first command in a first queue, detecting a fail of a first address that corresponds to the first command, when the first address is determined as a fail address, queuing a second address and a second command in the first queue, wherein the second address is obtained by remapping the first address and the second command corresponds to the second address, and outputting the second command and the second address from the first queue.

30 Claims, 22 Drawing Sheets

(56) References Cited

FOREIGN PATENT DOCUMENTS

| KR | 1091844 | 11/2008 |
| KR | 0923989 | 12/2008 |
| KR | 10-2010-0077118 | 7/2010 |
| KR | 10-2011-0099564 | 9/2011 |
| KR | 1131569 | 4/2012 |
| KR | 10-2012-0070408 | 6/2012 |

* cited by examiner

METHOD AND CONTROLLER FOR RECEIVING AND OUTPUTTING COMMANDS AND ADDRESSES USING A QUEUE

CROSS-REFERENCE TO RELATED APPLICATIONS

This application claims the benefit of Korean Patent Application No. 10-2012-0139827, filed on Dec. 4, 2012, in the Korean Intellectual Property Office, the disclosure of which is incorporated herein in its entirety by reference.

BACKGROUND

The disclosed embodiments relate to a memory controller and a memory system, and more particularly, to a memory controller and a memory system that may repair a defective memory cell.

Due to development of computers or mobile devices, there is an increasing demand for high integration and high functionality of a semiconductor device. A semiconductor memory device may be developed to have increased capacity and speed, and many attempts are being made to make a smaller semiconductor memory device including a memory cell with larger capacity and to operate a semiconductor memory device at a faster speed.

However, since a semiconductor memory device is developed to have high integration, large capacity, and high functionality, a line width of a circuit is decreased, a total number of manufacturing processes is increased and the manufacturing processes become complicated. These factors may cause a decrease in a yield rate of a chip.

SUMMARY

Disclosed embodiments provide a memory controller to control a semiconductor memory cell including a defective cell, and while the memory controller performs a repair operation, the memory controller may maintain a fast data processing speed.

According to one embodiment, an operating method performed by a memory controller includes operations of queuing a first command in a first queue; detecting a fail of a first address that corresponds to the first command; when the first address is determined as a fail address, queuing a second address and a second command in the first queue, wherein the second address is obtained by remapping the first address and the second command corresponds to the second address; and outputting the second command and the second address from the first queue.

When the first command exists in the CMD queue, the operation of queuing the second command may include an operation of replacing the first command and the first address with the second address and the second command.

When the first command is a read command, the operating method may further include an operation of blocking an output of first data to an external source and outputting second data to the external source, wherein the first data is received in response to the first command and the second data is received in response to the second command.

The operating method may further include an operation of determining whether the first address is a fail address, by comparing the first data with the second data.

When the first command is a write command, the second command and the second address may be output, regardless of whether the first command and the first address are output.

The operating method may further include an operation of generating the first command and the first address by decoding a packet that is received from an external source.

The memory controller may include a storing unit that stores address information of a defective cell of a semiconductor memory device, and the operation of detecting the fail may include an operation of comparing a match between the first address and the address information that is stored in the storing unit.

The second address may be generated whereby an access time corresponding to the second command may be less than an access time corresponding to the first command.

The second command may be controlled to be first output, compared to other commands that queue in the first queue.

When the first address is detected as a normal address, the first command and the first address may be output according to a queuing order of the first queue.

The first command may be generated by decoding an external packet, and the second command may request a memory operation equal to a memory operation of the first command.

The memory controller may include a content addressable memory (CAM) to perform the detecting, the CAM may receive and temporarily store the first command, and the temporarily stored first command may be provided as the second command to the first queue.

The operation of detecting the fail may occur at a same time as the queuing of the first command or outputting the first command and the first address.

The first address may correspond to an address in a normal memory area of a semiconductor memory device and the second address may correspond to an address in a redundancy memory area of the semiconductor memory device According to another embodiment, a memory controller includes a decoder for decoding a packet and generating a command and an address that corresponds to the command; a first queue for storing the command and the address; a content addressable memory (CAM) for detecting a fail of a first address that corresponds to a first command, and when the first address is detected as a fail address, for outputting a second address and a second command to the first queue, wherein the second address is obtained by remapping the first address, and the second command corresponds to the second address; and a controller input/output (controller I/O) for outputting the command and the address that are stored in the first queue.

According to another embodiment, a memory system includes a semiconductor memory device for storing data; and a memory controller for queuing a first command, for simultaneously performing an operation of outputting the first command and an operation of detecting a fail of a first address that corresponds to the first command, and when the first address is detected as a fail address, for outputting a second address, which is obtained by remapping the first address, and a second command that corresponds to the second address.

According to another embodiment, a memory controller includes a decoder for decoding a packet and generating a command and an address that corresponds to the command; a content addressable memory (CAM) for storing address information of a defective cell of a semiconductor memory device, for detecting a fail of the address by comparing the address with the address information of the defective cell, and according to a result of the detecting, for outputting a remapping address; and a first queue for queuing the command and the address that corresponds to the command, regardless of the result of the detecting, and for additionally queuing the remapping address when the address corresponds to a fail address.

According to another embodiment, a method for a memory device includes receiving a first command and a first address corresponding to the first command; determining whether the first address corresponds to a fail address and concurrently storing the first command and first address in a queue; when the first address corresponds to a fail address, storing a second address in the queue, the second address corresponding to the first address; and when the first address does not correspond to a fail address, using the first address for the first command.

BRIEF DESCRIPTION OF THE DRAWINGS

Exemplary embodiments will be more clearly understood from the following detailed description taken in conjunction with the accompanying drawings in which.

DETAILED DESCRIPTION

Figure 1:
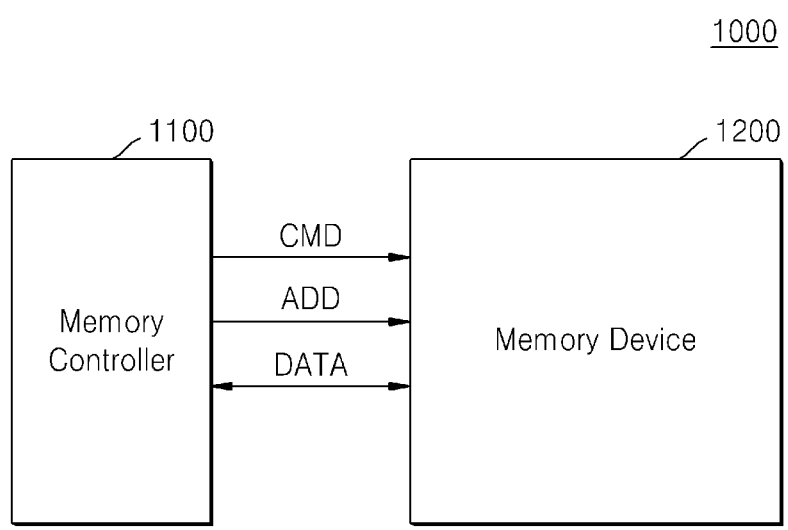
FIG. 1 is a block diagram of a semiconductor memory system according to an exemplary embodiment.

The present disclosure now will be described more fully hereinafter with reference to the accompanying drawings, in which various embodiments are shown. The invention may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Some embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a semiconductor memory system 100 according to an exemplary embodiment. Referring to FIG. 1, the semiconductor memory system 100 includes a memory controller 1100 and a semiconductor memory device 1200. The memory controller 1100 transmits a command signal CMD and an address signal ADD to the semiconductor memory device 1200 or exchanges data DATA with the semiconductor memory device 1200.

The semiconductor memory device 1200 of FIG. 1 may be formed as a random access memory employing a fast processing speed. The semiconductor memory device 1200 may include a dynamic random access memory (DRAM) cell as the random access memory. Alternatively, the semiconductor memory device 1200 may include another memory cell, which is enabled for a random access, such as a magnetoresistive random access memory (MRAM) cell, a STT-MRAM cell, a phase-change memory (PRAM) cell, a resistive random access memory (RRAM) cell, or the like. The semiconductor memory device 1200 may include at least one defective cell, and in order to overcome the defective cell, the memory controller 1100 may detect the defective cell and then may replace the defective cell with non-defective cell (also referred to herein as a normal cell). The defective cell may correspond to a cell in which a hard error or a soft error occurs or may correspond to a cell having an inferior memory characteristic such as a data retention characteristic or the like. For example, using a defective cell may result in an undesired or unexpected processing result. Also, in one or more embodiments, a term "defective cell" may also be referred to using another term such as an error cell, a fail cell, or the like.

The memory controller 1100 may be implemented equally to or similarly as a DRAM controller. Also, the memory controller 1100 may have an interface that is equal to or similar to a DRAM interface. However, the present disclosure is not limited to the aforementioned example, and implementation of the memory controller 1100 or a structure of the interface of the memory controller 1100 may vary according to a type of the semiconductor memory device 1200.

Figure 2:
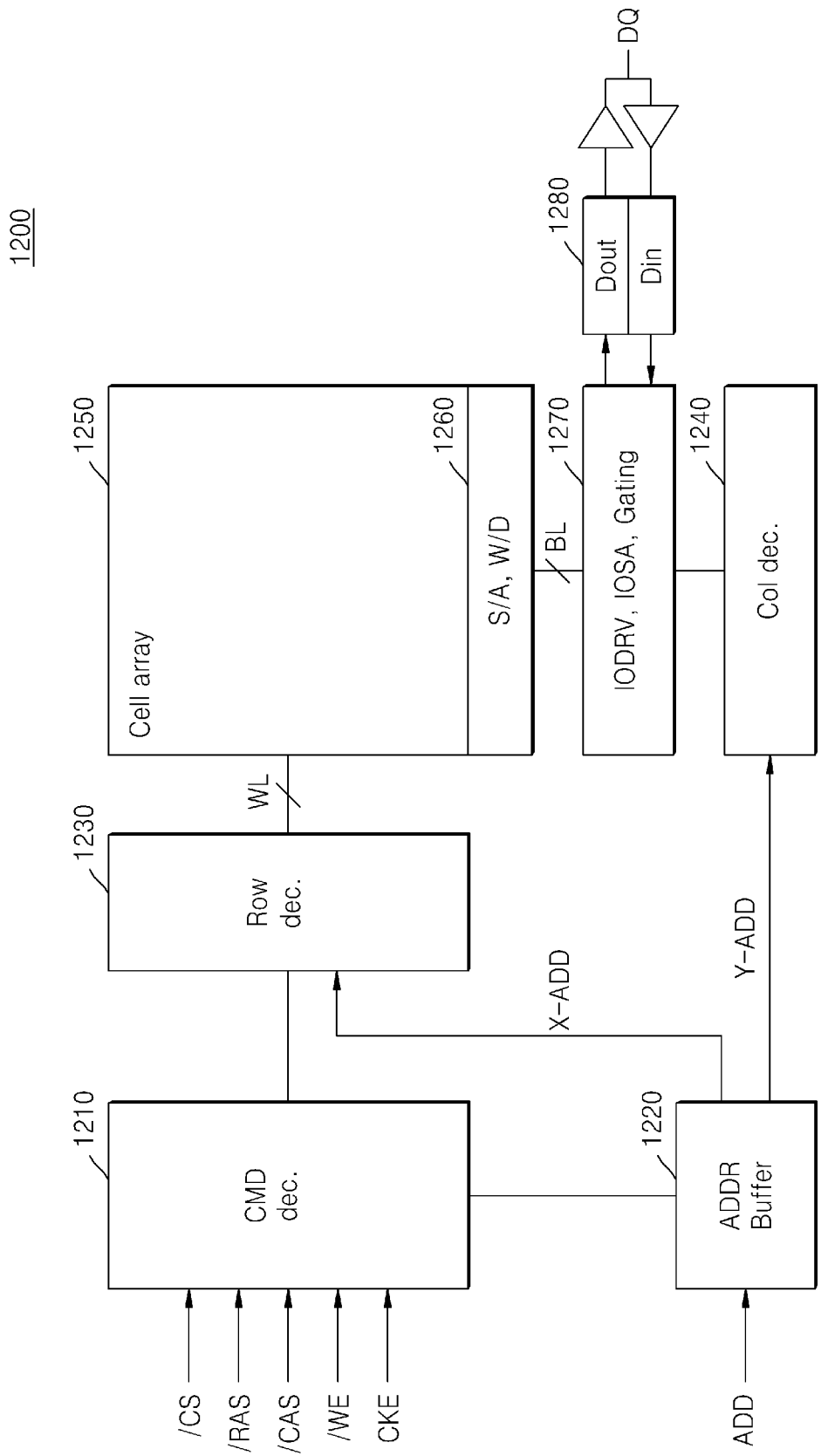
FIG. 2 is a block diagram of a semiconductor memory device shown in FIG. 1, according to an exemplary embodiment.

FIG. 2 is a block diagram of the semiconductor memory device 1200 shown in FIG. 1, according to one exemplary embodiment. Referring to FIGS. 1 and 2, the semiconductor memory device 1200 includes a command decoder 1210, an address buffer 1220, a row decoder 1230, a column decoder 1240, a cell array 1250, a write driver/sense amplifier 1260, an input/output (I/O) driver unit 1270, and a data output unit 1280.

The command decoder 1210 receives a chip selection signal /CS, a row address strobe /RAS, a column stress strobe /CAS, a write enable signal /WE, and a clock enable signal CKE from the memory controller 1100, and then performs a decoding operation. According to a result of the decoding operation, the semiconductor memory device 1200 performs a command issued by the memory controller 1100.

An address signal ADD that is received from the memory controller 1100 is stored in the address buffer 1220. Afterward, the address buffer 1220 delivers a row address X-ADD to the row decoder 1230, and delivers a column address Y-ADD to the column decoder 1240.

Each of the row decoder 1230 and the column decoder 1240 includes a plurality of switches. The row decoder 1230 selects a wordline WL in response to a row address, and the column decoder 1240 selects a bitline BL in response to a column address. The cell array 1250 includes a memory cell that is positioned at a cross of the wordline WL and the bitline BL.

The write driver/sense amplifier 1260 includes a plurality of sense amplifier circuits for sensing/amplifying a data voltage that is applied to the bitline BL. A data signal that is sensed/amplified by the write driver/sense amplifier 1260 is delivered to the data output unit 1280 via the I/O driver unit 1270. The data output unit 1280 outputs data from the I/O driver unit 1270 to the memory controller 1100, or outputs data from the memory controller 1100 to the I/O driver unit 1270.

Figure 3:
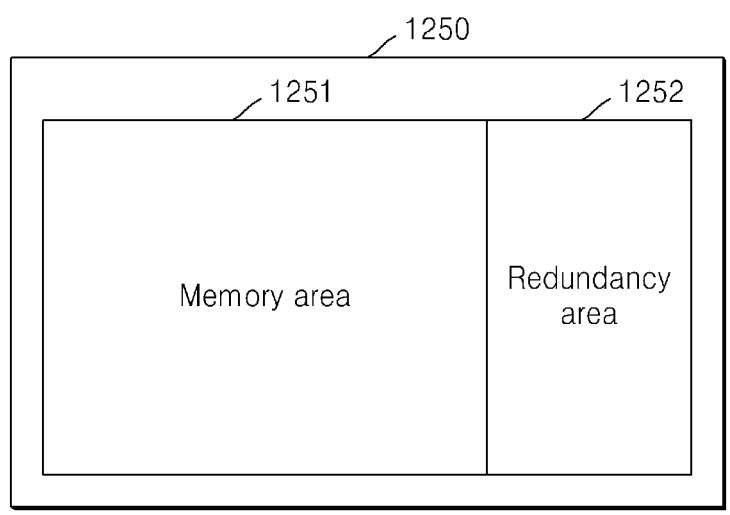
FIG. 3 is a block diagram of areas of a cell array shown in FIG. 2, according to an exemplary embodiment.

FIG. 3 is a block diagram of areas of the cell array 1250 shown in FIG. 2, according to an exemplary embodiment. Referring to FIG. 3, the cell array 1250 includes a memory area 1251 and a redundancy area 1252. The memory area 1251 includes data stored therein, and the redundancy area 1252 includes extra memory cells to replace a defective memory cell in the memory area 1251. In order to replace the defective memory cell with a redundancy memory cell by using a repair method, a fuse cutting process may be performed before the semiconductor memory device 1200 is packaged, or address information of the defective memory cell may be stored by using a content addressable memory (CAM) and then the stored address information may be compared to address information of an access target memory cell, so that a repair may be performed.

Figure 4:
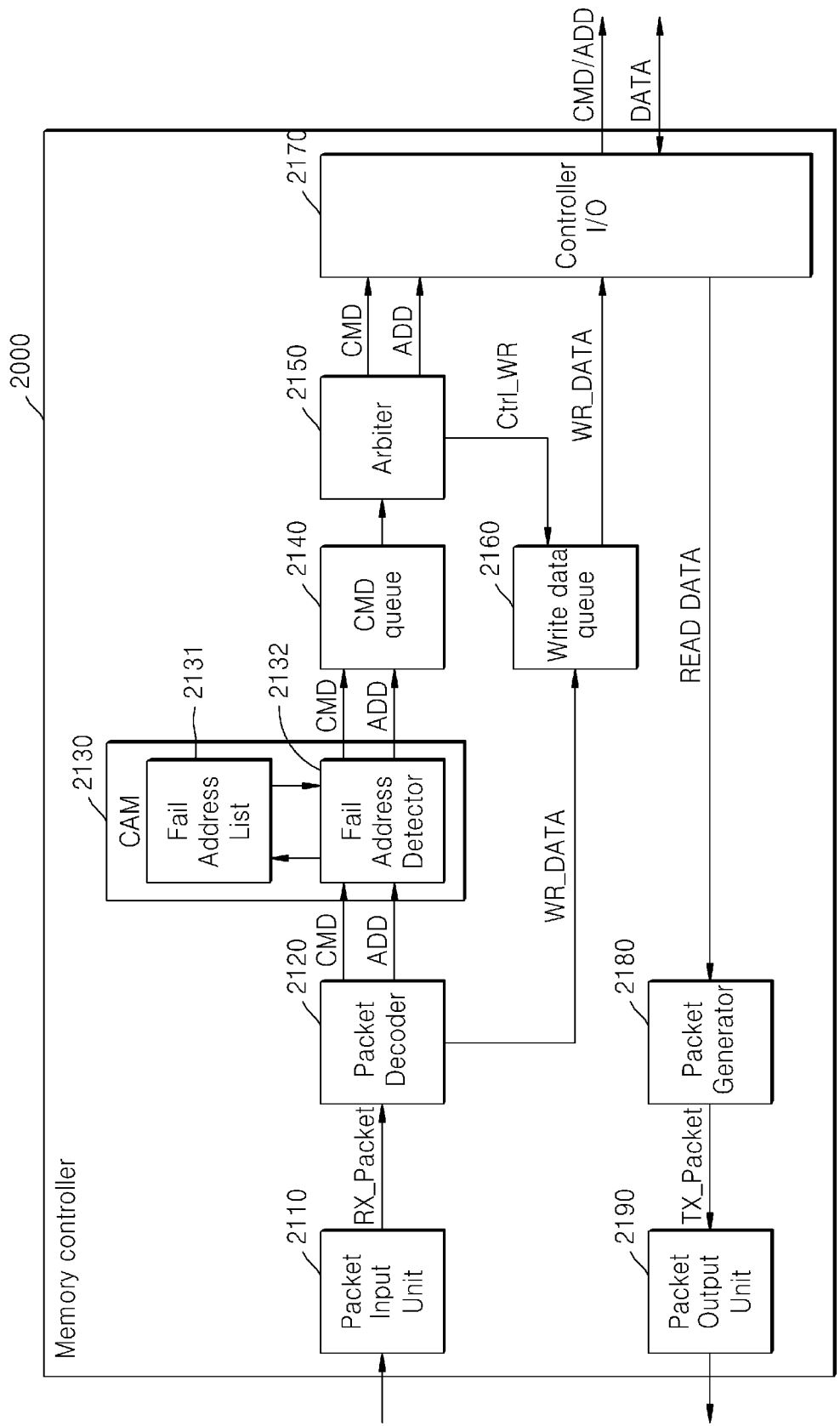
FIG. 4 is a block diagram of a memory controller, according to an exemplary embodiment.
Figure 5:
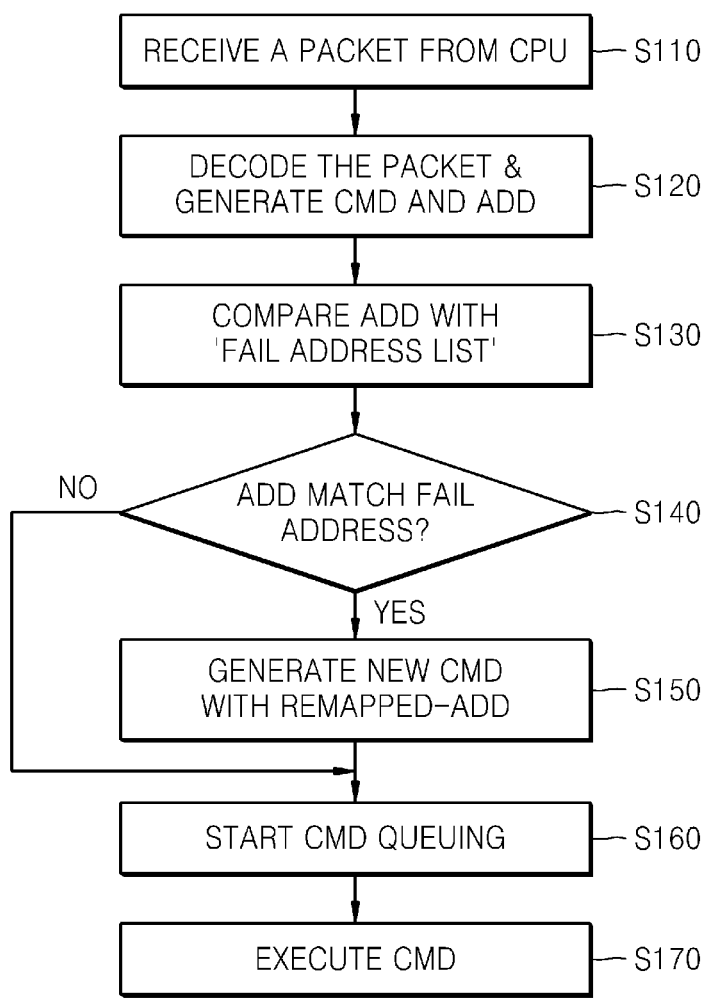
FIG. 5 is a flowchart of an operating method performed by the memory controller, according to an exemplary embodiment.

FIGS. 4 and 5 are diagrams illustrating a memory controller 2000 and operations of the memory controller 2000, according to disclosed embodiments. The memory controller 2000 may include a CAM for repairing a defective memory cell.

FIG. 4 is a block diagram of the memory controller 2000, according to an exemplary embodiment. Referring to FIG. 4, the memory controller 2000 includes a packet input unit 2110, a packet decoder 2120, a CAM 2130, a command queue (CMD queue) 2140, an arbiter 2150, a write data queue 2160, a controller I/O 2170, a packet generator 2180, and a packet output unit 2190.

The packet input unit 2110 receives a packet RX_Packet, which includes information for accessing the semiconductor memory device 1200, from an external device such as a central processing unit (CPU) (not shown). The packet decoder 2120 decodes the packet RX_Packet and then generates a command CMD and an address ADD corresponding to the command CMD. In one embodiment, one command CMD and one address ADD may be generated from each received packet. In another embodiment, at least two commands CMD and at least two addresses ADD may be generated from each received packet.

The CAM 2130 includes a fail address list 2131 (the fail address list can be referred as a fail address storing unit) and a fail address detector 2132. The fail address list 2131 stores address information of defective cells included in the cell array 1250 of the semiconductor memory device 1200. The fail address detector 2132 compares a match between the address ADD and the address information stored in the fail address list 2131, and then detects whether the address ADD is a fail address. The fail address may be defined as an address that indicates the defective cell, and when the address ADD is not of the defective cell, the address ADD may be a non-defective address (also referred to herein as a normal address) that indicates a non-defective (e.g., normal cell). Also, when the address ADD indicates the defective cell, the fail address detector 2132 performs an address remapping operation so as to repair the defective cell, and outputs a remapped address to the CMD queue 2140.

The CMD queue 2140 includes a space for storing a plurality of commands and addresses, queues the commands and addresses in an order of receipt, and transmits them to the arbiter 2150. The CMD queue 2140 may operate in a first-in first-out (FIFO) manner in which information that is first inserted into the space is first deleted.

The arbiter 2150 is a circuit for controlling the selection of signals in a sequential order from among a plurality of input signals according to a predetermined rule and for controlling the rest of the input signals to queue. Thus, the arbiter 2150 receives a plurality of commands CMD that queue in the CMD queue 2140 and addresses ADD that correspond to the commands CMD, and control the commands CMD and the addresses ADD to be executed according to a priority order. The execution of the command CMD and the address ADD may mean an operation of outputting the command CMD and the address ADD to the semiconductor memory device 1200, according to the priority order.

The write data queue 2160 receives a write control signal Ctrl_WR from the arbiter 2150, and, in response to the write control signal Ctrl_WR, the write data queue 2160 outputs data from the packet decoder 2120 to the controller I/O 2170.

The controller I/O 2170 may be implemented as a physical layer area. Thus, the controller I/O 2170 provides mechanical, electrical, and functional means to define an interface between transmission media and to perform signal transmission between data link layers. The controller I/O 2170 transmits the command CMD, the address ADD, and data DATA, which are generated in the memory controller 2000, to the semiconductor memory device 1200.

The packet generator 2180 receives read data from the semiconductor memory device 1200 and thus generates a packet, and the packet output unit 2190 outputs a packet TX_Packet, which is generated in the packet generator 2180, to an external device such as a CPU (not shown).

FIG. 5 is a flowchart of an operating method performed by the memory controller 2000, according to an exemplary embodiment. Referring to FIGS. 4 and 5, the memory controller 2000 receives a packet including information for accessing the semiconductor memory device 1200 from a CPU (not shown) (operation S110). Afterward, the memory controller 2000 decodes the packet and thus generates a command CMD and an address ADD corresponding to the command CMD (operation S120). As a plurality of packets are input from the CPU, a plurality of commands CMD and addresses ADD may be generated from the plurality of packets.

The CAM 2130 compares an input address ADD with address information that is stored in the fail address list 2131, and for example, the CAM 2130 compares a match between the input address ADD and the stored address information (operation S130). By doing so, the CAM 2130 determines whether the address ADD is a fail address that indicates a defective cell (operation S140). When the address ADD is the fail address, the address ADD is remapped so that a remapped address indicating a normal cell is generated, and a new command CMD corresponding to the remapped address is also generated (operation S150). Then, the generated new command CMD and the remapped address are provided to the CMD queue 2140.

However, when the address ADD is not the fail address, the address ADD and the command CMD are provided to the CMD queue 2140, without separately generating the remapped address.

A plurality of the commands CMD and the addresses ADD that are provided to the CMD queue 2140 sequentially queue in the CMD queue 2140 (S160). Afterward, the commands CMD and the addresses ADD are transmitted to the arbiter 2150 in an order by which the commands CMD and the addresses ADD queue. According to control by the arbiter 2150, the commands CMD and the addresses ADD are executed (operation S170). The execution of the commands CMD and the addresses ADD may mean an operation of outputting the commands CMD and the addresses ADD to the semiconductor memory device 1200.

In the aforementioned operations, the CMD queue 2140 may include a space for storing the commands CMD and the addresses ADD and may store the commands CMD and the addresses ADD in an order of receipt from the CAM 2130. Also, the CAM 2130 may further store address information indicating a defective cell of the cell array 1250 of the semiconductor memory device 1200 and address information indicating a normal cell to replace the defective cell. In a case where an access target memory cell is the defective cell, the address ADD that is generated by decoding the packet is remapped so that an address that indicates a normal cell is generated.

Also, in an operation of generating the command CMD that corresponds to the remapped address, the command CMD that is generated by decoding the packet may be temporarily stored in the CAM 2130 and may be output when the remapped address is output. As such, in one embodiment, the command CMD and the address ADD are provided to the CAM 2130, the CAM 2130 compares the address ADD with the address information related to the defective cell, and when the address ADD matches the address information related to the defective cell, thus indicating the defective cell, the CAM 2130 outputs the command CMD and the remapped address. An operation by which the CAM 2130 outputs the command CMD that corresponds to the remapped address may include an operation in which the CAM 2130 generates the command CMD that corresponds to the remapped address.

FIGS. 6 through 9 illustrate a memory controller 3000 and flowcharts of operating methods by the memory controller 3000, according to certain exemplary embodiments.

Figure 6:
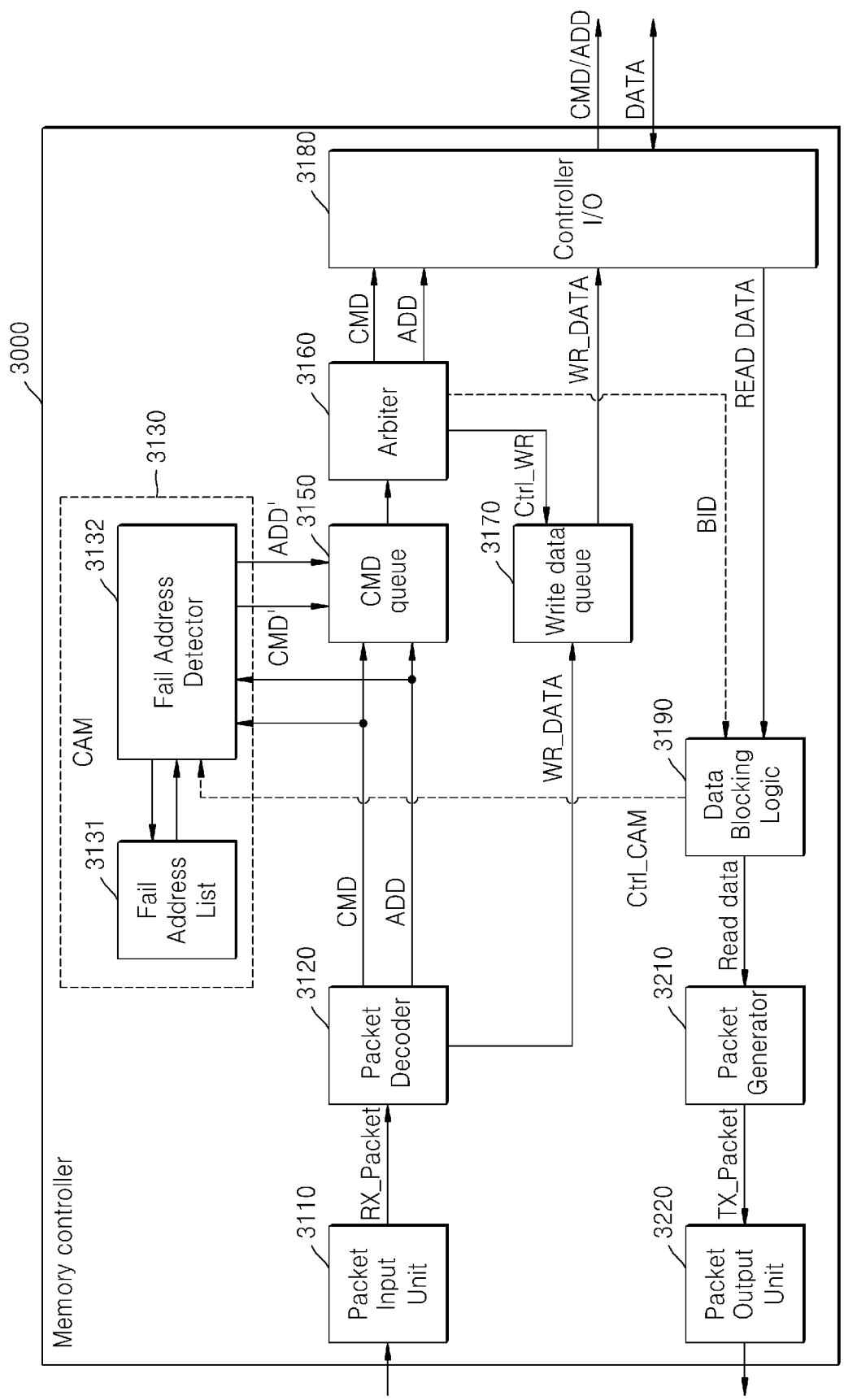
FIG. 6 is a block diagram of a memory controller, according to another exemplary embodiment.

FIG. 6 is a block diagram of the memory controller 3000, according to one embodiment. Referring to FIG. 6, the memory controller 3000 includes a packet input unit 3110, a packet decoder 3120, a CAM 3130, a CMD queue 3150, an arbiter 3160, a write data queue 3170, a controller I/O 3180, data blocking logic 3190, a packet generator 3210, and a packet output unit 3220.

The packet input unit 3110 receives a packet, which includes information for accessing the semiconductor memory device 1200, from an external device such as a CPU (not shown). The packet decoder 3120 decodes the packet and thus generates a command CMD and an address ADD corresponding to the command CMD. As a plurality of the packets are decoded, a plurality of the commands CMD and the addresses ADD are generated.

The CAM 3130 includes a fail address list 3131 and a fail address detector 3132. The fail address list 3131 stores address information of a defective cell included in the cell array 1250 of the semiconductor memory device 1200 (hereinafter, the address information of the defective cell is referred to as fail address information). The fail address list 3131 may include a volatile memory or a non-volatile memory, and when a fast processing speed is required, the fail address list 3131 may include a memory such as an SRAM. When the volatile memory such as the SRAM is used, address information related to a defective cell may be stored in a separate non-volatile memory (not shown) in the memory controller 3000, and when a system operates, the address information stored in the non-volatile memory may be loaded to the fail address list 3131. Alternatively, the address information related to the defective cell may be stored in the semiconductor memory device 1200, and when the system operates, the fail address information from the semiconductor memory device 1200 may be stored in the fail address list 3131. Alternatively, the fail address list 3131 may include the non-volatile memory, and an address comparing operation may be performed by using the fail address information stored in the non-volatile memory.

Figure 7A:
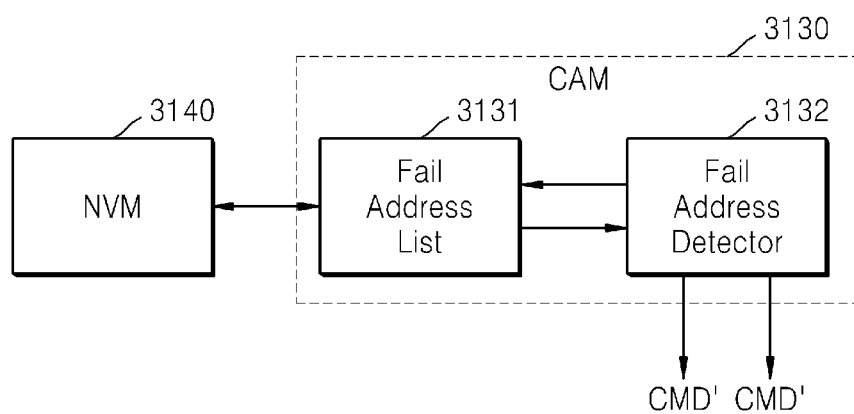
FIG. 7A illustrates an example in which a memory controller further includes a non-volatile memory, according to another exemplary embodiment.

FIG. 7A illustrates an example in which the memory controller 3000 further includes a non-volatile memory (NVM) 3140 for storing fail address information, according to one exemplary embodiment. As illustrated in FIG. 7A, the fail address information that is stored in the NVM 3140 is loaded to the fail address list 3131. Here, according to a total number of programming operations, the NVM 3140 may be one-time programmable (OTP) or multi-time programmable (MTP). In one embodiment, the NVM 3140 may include an OTP device that can be programmed only once. Or, as the fail address information of the semiconductor memory device 1200 is updated, more information may be added to and stored in the NVM 3140.

Referring back to FIG. 6, the fail address detector 3132 compares a match between the address ADD and the address information stored in the fail address list 3131, and then detects whether the address ADD is a fail address.

For example, when a first command CMD and a first address ADD corresponding to the first command CMD are input, the fail address detector 3132 may compare the first address ADD with the address information stored in the fail address list 3131, and according to a result of the comparison, the fail address detector 3132 may detect the first address ADD as a fail address. According to a result of the detection, the fail address detector 3132 may output a second address ADD' obtained by remapping the first address ADD and may output a second command CMD', which corresponds to the second address ADD', to the CMD queue 3150. Here, the second command CMD' may request a memory operation equal to a memory operation of the first command CMD and may be equal to the first command CMD that is generated by the packet decoder 3120.

For example, the fail address detector 3132 may receive and temporarily store the first command CMD, and may provide the temporarily stored first command CMD as the second command CMD' to the CMD queue 3150. Also, the fail address list 3131 may further store a remapping address to replace an address of a defective cell with an address of a normal cell, and may provide a remapping address as the second address ADD', which corresponds to the first address ADD, to the CMD queue 3150.

The CMD queue 3150 queues commands and addresses according to an input order and transmits them to the arbiter 3160. The CMD queue 3150 may operate in an FIFO manner in which information that is first inserted into the CMD queue 3150 is first deleted.

The arbiter 3160 is a circuit for controlling the selection of signals in a sequential order from among a plurality of input signals according to a predetermined rule and for controlling the rest of the input signals to queue. Thus, the arbiter 3160 receives a plurality of commands CMD that queue in the CMD queue 3150 and addresses ADD that correspond to the commands CMD, and controls the commands CMD and the addresses ADD to be executed according to a priority order.

According to the embodiment of FIG. 6, the CAM 3130 and the CMD queue 3150 are positioned in parallel with respect to a path for transmission of the commands CMD and the addresses ADD. Thus, an operation in which the CAM 3130 detects a fail of an address and an operation in which the CMD queue 3150 queues the commands CMD may be simultaneously performed. As such, regardless of a result with respect to detecting the fail of the address, the commands CMD and the addresses ADD may queue in the CMD queue 3150 and may be provided to the semiconductor memory device 1200 according to a priority order operation by the arbiter 3160. Accordingly, the CAM 3130 may not be positioned on a main path for transmission of the commands CMD and the addresses ADD, and an increase of latency due to a fail address detection operation by the CAM 3130 may be minimized. The fail address detection by the CAM 3130 may be simultaneously performed when the command CMD is executed by the arbiter 3160, or alternatively may be performed while the command CMD and the address ADD are output to the semiconductor memory device 1200 and while waiting for a response thereof.

The write data queue 3170 receives a write control signal Ctrl_WR from the arbiter 3160, and in response to the write control signal Ctrl_WR, the write data queue 3170 outputs data from the packet decoder 3120 to the controller I/O 3180.

The controller I/O 3180 may be implemented as a physical layer area. Thus, the controller I/O 3180 provides mechanical, electrical, and functional means to define an interface between transmission media and to perform signal transmission between data link layers. The controller I/O 3180 transmits the command CMD, the address ADD, and data DATA, which are generated in the memory controller 3000 to the semiconductor memory device 1200.

As described above, since the command CMD and the address ADD are output regardless of the result with respect to detecting the fail of the address, a data access operation may be performed on a defective cell. In an embodiment, when the defective cell is read, it is required to block data of the defective cell from being provided to an external device (e.g., a CPU). When the address ADD is detected as the address of the defective cell and a read operation is performed on the defective cell, the arbiter 3160 outputs a control signal BID to the data blocking logic 3190 so as to block the data of the defective cell, which is read by the semiconductor memory device 1200, from being transmitted to the CPU.

The data blocking logic 3190 receives the control signal BID from the arbiter 3160, and blocks the data that is read from the defective cell. Afterward, data that is read from a normal cell according to a remapped address is received and then is output to the packet generator 3210.

The packet generator 3210 receives the data that is read by the semiconductor memory device 1200, and then generates the packet, and the packet output unit 3220 outputs the packet, which is generated by the packet generator 3210, to the CPU.

Figure 7B:
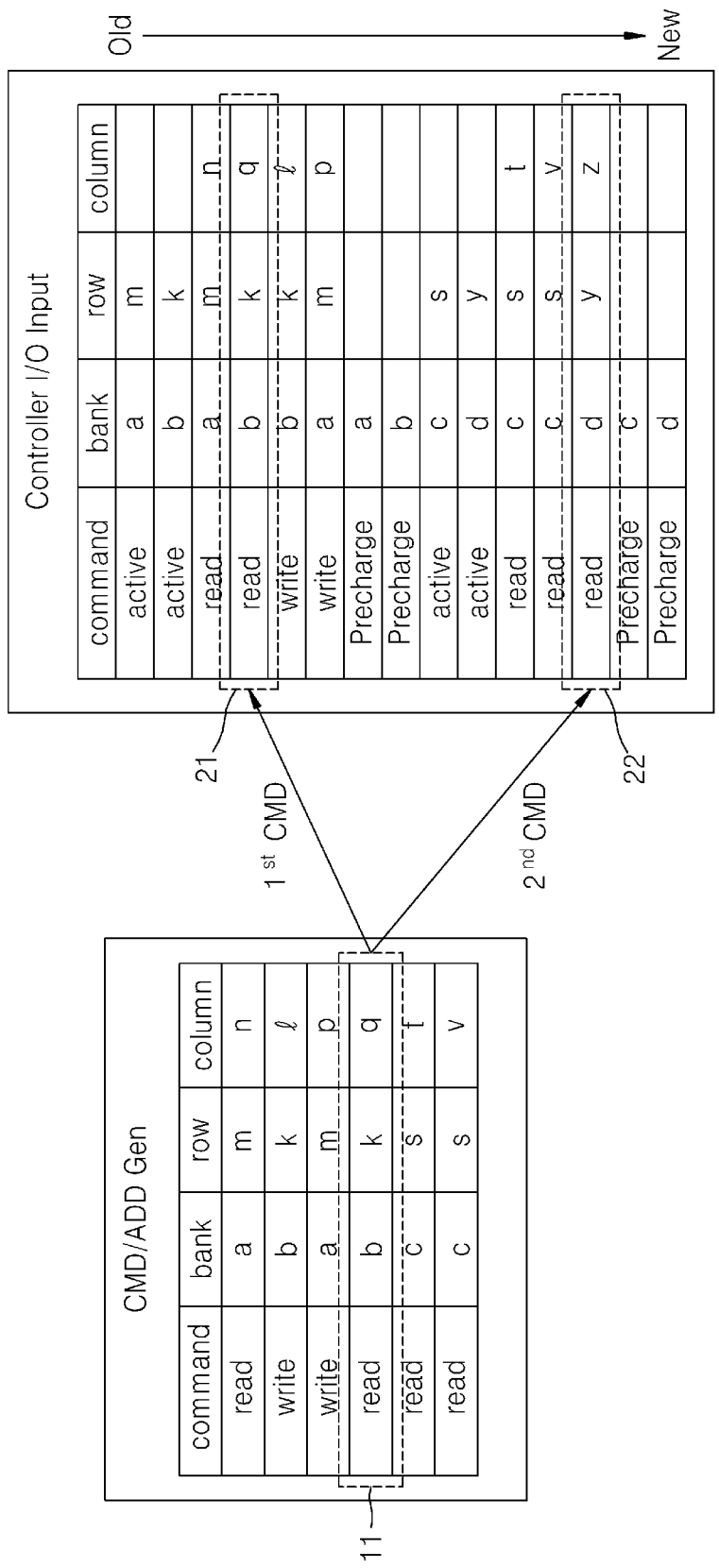
FIG. 7B illustrates a list of commands/addresses that are generated by a packet decoder, and a list of output commands/addresses.

FIG. 7B illustrates a list of commands/addresses that are generated by the packet decoder 3120 of FIG. 6, and a list of commands/addresses that are input to the controller I/O 3180. Referring to FIGS. 6 and 7B, the packet decoder 3120 decodes a packet that is received from an external source, and then generates the command CMD and the address ADD that corresponds to the command CMD.

For example, a command/address 11 (for example, a fourth command/address) in the list of commands/addresses indicates a request that involves reading a memory cell at a cross point of a $k_{th}$ row and a $q_{th}$ column of a b bank. The generated commands/addresses sequentially queue in the CMD queue 3150. The memory cell that corresponds to the $k_{th}$ row and the $q_{th}$ column may be a defective cell. The packet decoder 3120 may generate the commands/addresses, and the arbiter 3160 may generate an active command Active and a pre-charge command Pre-charge. The commands/addresses that queue in the CMD queue 3150, and the active command active and the pre-charge command Pre-charge, which are generated by the arbiter 3160, may be input to the controller I/O 3180.

The CMD queue 3150 queues the command/address 11 as a first command/first address 21, wherein the command/address 11 is received from the packet decoder 3120. While the first command/first address 21 queues for an output in the CMD queue 3150, the CAM 3130 may compare the first address and fail address information and thus may detect a fail of the first address.

When the first address is detected as a normal address, the first command/first address 21 may be output to the semiconductor memory device 1200 according to a queue order in the CMD queue 3150. However, when the first address is detected as the defective cell, the CAM 3130 may generate a second address via an address remapping operation and may transmit a second command, which corresponds to the second address, to the CMD queue 3150. Referring to FIG. 7B, a second command/second address 22 indicates a request that involves reading a memory cell (the normal cell) at a cross point of an $y_{th}$ row and a $z_{th}$ column of a d bank.

The memory cell that corresponds to the second address may indicate a cell in a redundancy area of the semiconductor memory device 1200. Alternatively, a predetermined area of the cell array 1250 of the semiconductor memory device 1200 may be used to replace the defective cell, and the memory cell that corresponds to the second address may indicate a memory cell in the predetermined area. According to a position of a memory cell in the semiconductor memory device 1200, an access speed thereof may vary, and in this regard, the second address may be generated to indicate a memory cell of which access time that corresponds to the second command is relatively small. Although not illustrated, a separate storage medium (an embedded DRAM or SRAM) may be arranged in the memory controller 3000, and the second address may be generated with respect to a cell of the separate storage medium in the memory controller 3000.

In another embodiment, when the first address is detected as a fail address, and the second command/second address 22 queues in the CMD queue 3150, if the first command/first address 21 exists in the CMD queue 3150 (or, if the first command/first address 21 is not output to the semiconductor memory device 1200), the first command/first address 21 may be replaced with the second command/second address 22. For example, information of a position at which the first command/first address 21 exists may be updated to the second command/second address 22. As a result, the second command/second address 22 may be controlled to be output prior to other commands that queue further down in the CMD queue 3150.

Figure 8:
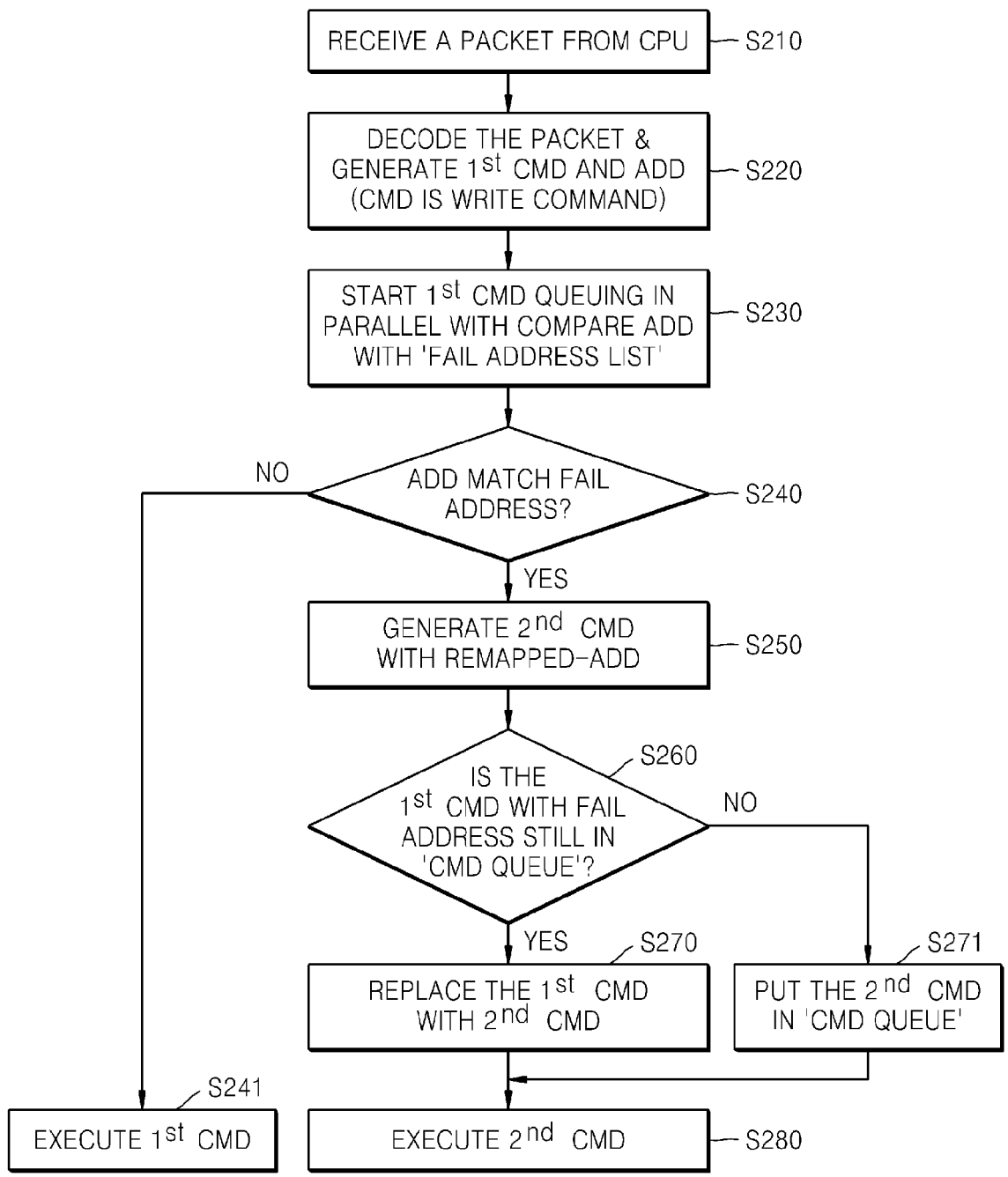
FIG. 8 is a flowchart of an operating method performed by a memory controller, according to another exemplary embodiment.

FIG. 8 is a flowchart of an operating method performed by the memory controller 3000, according to another exemplary embodiment. The flowchart of FIG. 8 involves the operating method related to writing data.

Referring to FIGS. 6 and 8, the memory controller 3000 receives a packet, which includes information for accessing the semiconductor memory device 1200, from an external device such as a CPU (not shown) (operation S210). Via a packet decoding operation, a first command CMD and a first address ADD that corresponds to the first command CMD are generated (operation S220). Here, the first command CMD means a write command.

The CAM 3130 compares the first address ADD with address information that is stored in the fail address list 3131 (operation S230). Here, an operation of detecting a fail of the first address ADD and an operation of queuing the first command CMD may be simultaneously performed. For example, the two operations may occur at least part at the same time, so that they overlap and concurrently execute. In one embodiment, the operations start at the same time or substantially the same time (e.g., with minor delays due to, for example, latency resulting from different length wiring in circuitry). However, although not illustrated in FIG. 8, a time to start the operation of detecting the fail of the first address ADD may be changed. For example, in one embodiment, the operation of detecting the fail of the first address ADD and an operation of outputting the first command CMD and the first address ADD to the semiconductor memory device 1200 may be simultaneously performed. For example, these two operations may occur at least part at the same time, so that they overlap.

Based on a result of the comparison, the CAM 3130 detects whether the first address ADD is a fail address (operation S240). When the first address ADD is detected as a normal address, the first command CMD and the first address ADD are executed according to a queue order in the CMD queue 3150 and thus are output to the semiconductor memory device 1200 (operation S241).

On the other hand, when the first address ADD is detected as a fail address, a second address ADD' that is obtained by remapping the first address ADD and a second command CMD' that corresponds to the second address ADD' are generated (operation S250). Here, the first command CMD may be delivered to and temporarily stored in the CAM 3130 and then may be output as the second command CMD' from the CAM 3130.

Afterward, it is checked whether the first command CMD is still queued in the CMD queue 3150 (operation S260). When the first command CMD exists in the CMD queue 3150, the first command CMD and the first address ADD may be replaced with the second command CMD' and the second address ADD' (operation S270).

On the other hand, when the first command CMD does not exist in the CMD queue 3150 and has already been output from the memory controller 3000 to the semiconductor memory device 1200, the second command CMD' and the second address ADD' queue according to an order of commands/addresses that are input to the CMD queue 3150 (operation S271). Afterward, the second command CMD' and the second address ADD' that queue in the CMD queue 3150 are executed and then are output from the memory controller 3000 to the semiconductor memory device 1200 (operation S280).

According to one embodiment, regardless of a result with respect to detecting the fail of the first address ADD, the first command CMD and the first address ADD queue in the CMD queue 3150, and according to the result with respect to detecting the fail of the first address ADD, the second command CMD' and the second address ADD' selectively queue in the CMD queue 3150. A case in which the first command CMD does not exist in the CMD queue 3150 means that the first command CMD has already been output to the semiconductor memory device 1200 and thus data is written to a memory cell (i.e., a defective cell) that corresponds to the first command CMD. In this case, regardless of writing the data to the defective cell, the data may also be written to a memory cell (i.e., a normal cell) that corresponds to the second address ADD'. Afterward, if there is a read operation with respect to the first address ADD, the first address ADD will be determined as that of the defective cell; thus, it makes no difference although the data is written to the defective cell that corresponds to the first address ADD.

Also, a case in which the first command CMD exists in the CMD queue 3150 means that the first command CMD is not output to the semiconductor memory device 1200, so that the second command CMD' and the second address ADD' may queue by replacing the first command CMD and the first address ADD that exist in the CMD queue 3150.

Figure 9:
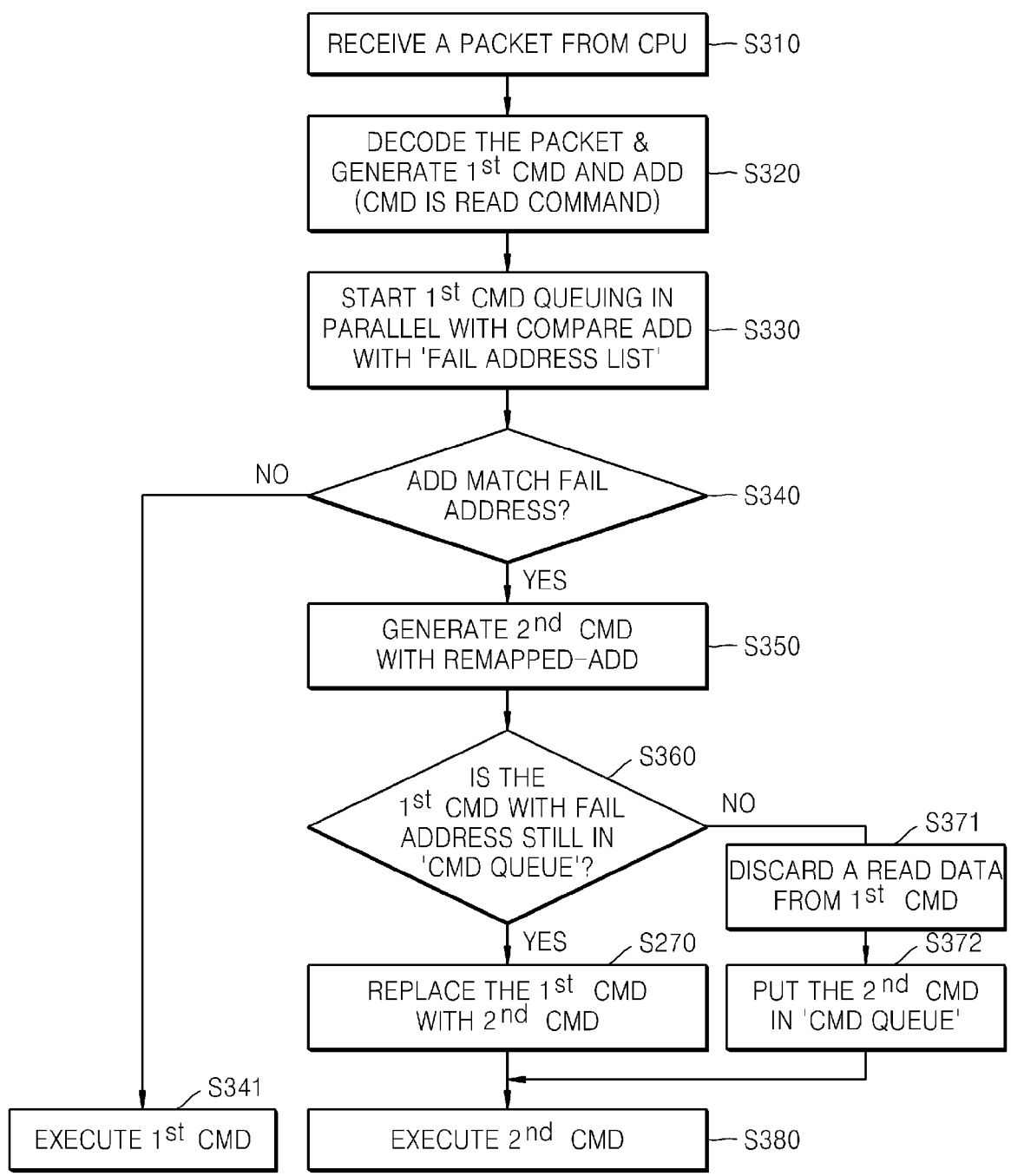
FIG. 9 is a flowchart of an operating method performed by a memory controller, according to another exemplary embodiment.

FIG. 9 is a flowchart of an operating method performed by the memory controller 3000, according to another exemplary embodiment. The flowchart of FIG. 9 involves the operating method related to reading data.

Referring to FIGS. 6 and 9, the memory controller 3000 receives a packet, which includes information for accessing the semiconductor memory device 1200, from an external device such as a CPU (not shown) (operation S310). The packet decoder 3120 decodes the packet and then generates a first command CMD and a first address ADD that corresponds to the first command CMD (operation S320). Here, the first command CMD means a read command.

The CAM 3130 compares a match between the first address ADD and address information that is stored in the fail address list 3131. Here, an operation of detecting a fail of the first address ADD and an operation of queuing the first command CMD may be simultaneously performed, or the operation of detecting the fail of the first address ADD and an operation of outputting the first command CMD and the first address ADD may be simultaneously performed (operation S330).

The CAM 3130 detects whether the first address ADD is a fail address (operation S340). When the first address ADD is determined as an address that indicates a normal cell, the first command CMD and the first address ADD that queue in the CMD queue 3150 are executed and then are output from the memory controller 3000 to the semiconductor memory device 1200 (operation S341).

On the other hand, in one embodiment, when the first address ADD is determined as an address that indicates a defective cell, a second address ADD' that is obtained by remapping the first address ADD and a second command CMD' that corresponds to the second address ADD' are generated (operation S350). For example, the first command CMD may be delivered to and temporarily stored in the CAM 3130 and then may be output as the second command CMD' from the CAM 3130.

One exemplary method involves checking whether the first command CMD still queues in the CMD queue 3150 (operation S360). When the first command CMD still exists in the CMD queue 3150, the combined first command CMD and the first address ADD may be replaced with the second command CMD' and the second address ADD' (operation S370). However, in one embodiment, when the first address ADD is a fail address, a command previously stored in the command queue 3150 may be used without having to replace the command with another command (such as the second command CMA' received from the CAM 3130).

In one embodiment, when the first command CMD does not exist in the CMD queue 3150 and is already output from the memory controller 3000 to the semiconductor memory device 1200, the method involves blocking an output of first data, which is received in response to the first command, to the external device (e.g., the CPU) (operation S371). In addition, the second command CMD' and the second address ADD' queue in the CMD queue 3150 (operation S372).

The second command CMD' and the second address ADD' that queue in the CMD queue 3150 are executed and then are output from the memory controller 3000 to the semiconductor memory device 1200 (operation S380).

According to the embodiment of FIG. 9, although a read target memory cell is the defective cell, the first command CMD and the first address ADD may be output. When the first command CMD and the first address ADD exist in the CMD queue 3150, information of a position where the first command CMD and the first address ADD are stored is replaced with information about the second command CMD' and the second address ADD', so that it is possible to prevent data from being read from the defective cell. Also, when the first command CMD and the first address ADD do not exist in the CMD queue 3150, it is possible to block that data (i.e., the first data) that is read from the defective cell and output to an external source, and in this regard, the data may be read from the normal cell by outputting the second command CMD' and the second address ADD' that queue in the CMD queue 3150 to the semiconductor memory device 1200.

Figure 10A:
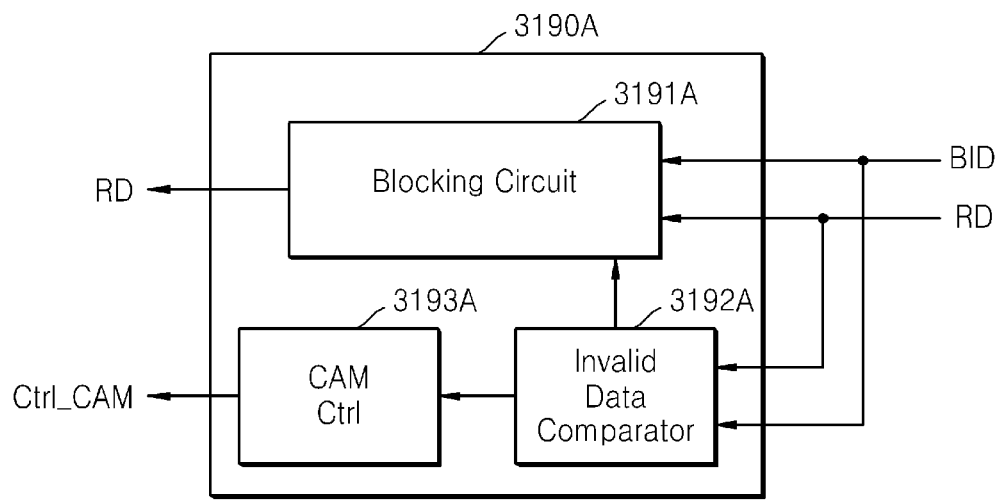
FIGS. 10A and 10B are block diagrams of a data blocking logic that is different from a data blocking logic of FIG. 6, according to an exemplary embodiment.
Figure 10B:
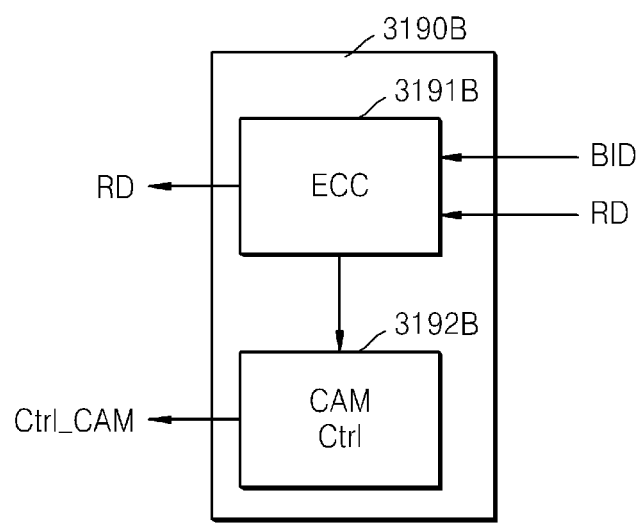
Figure 11:
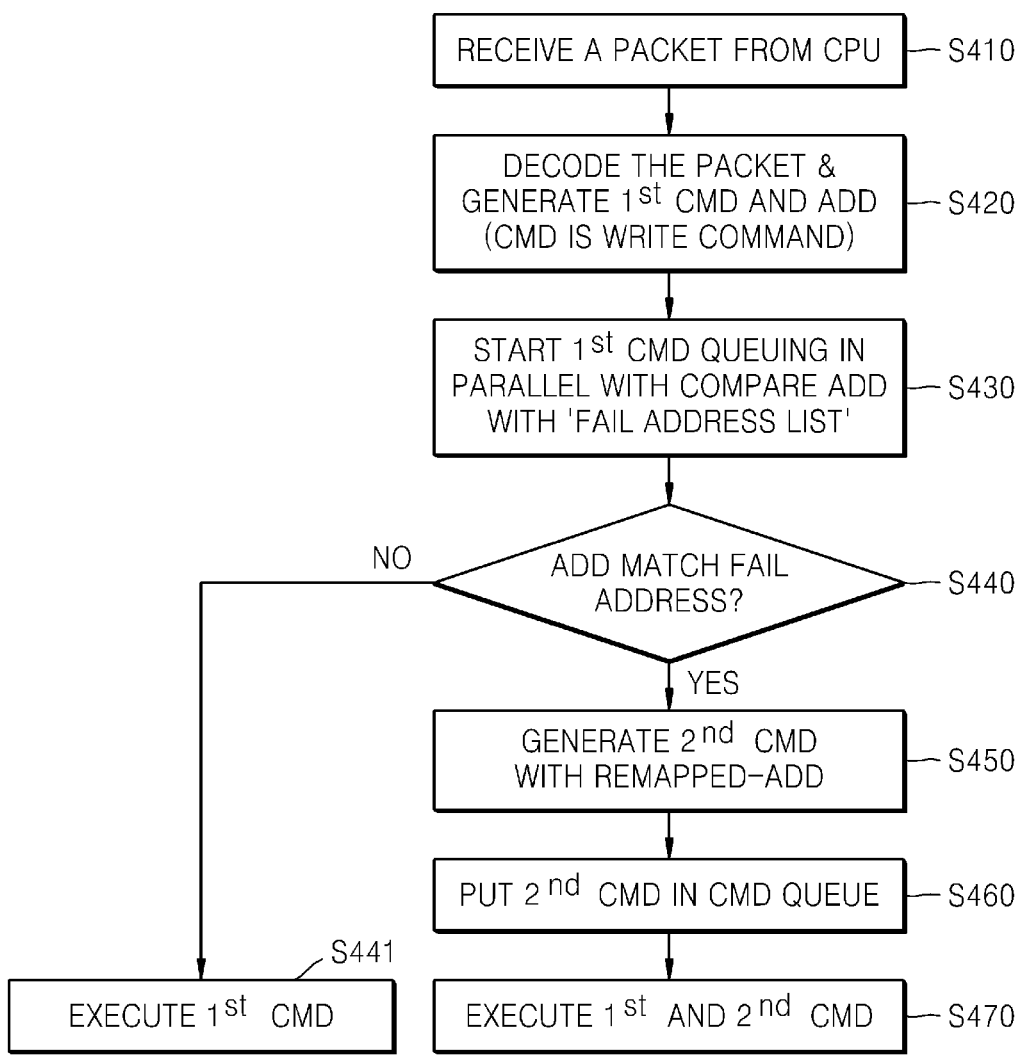
FIG. 11 is a flowchart of an operating method performed by a memory controller, according to another exemplary embodiment.
Figure 12:
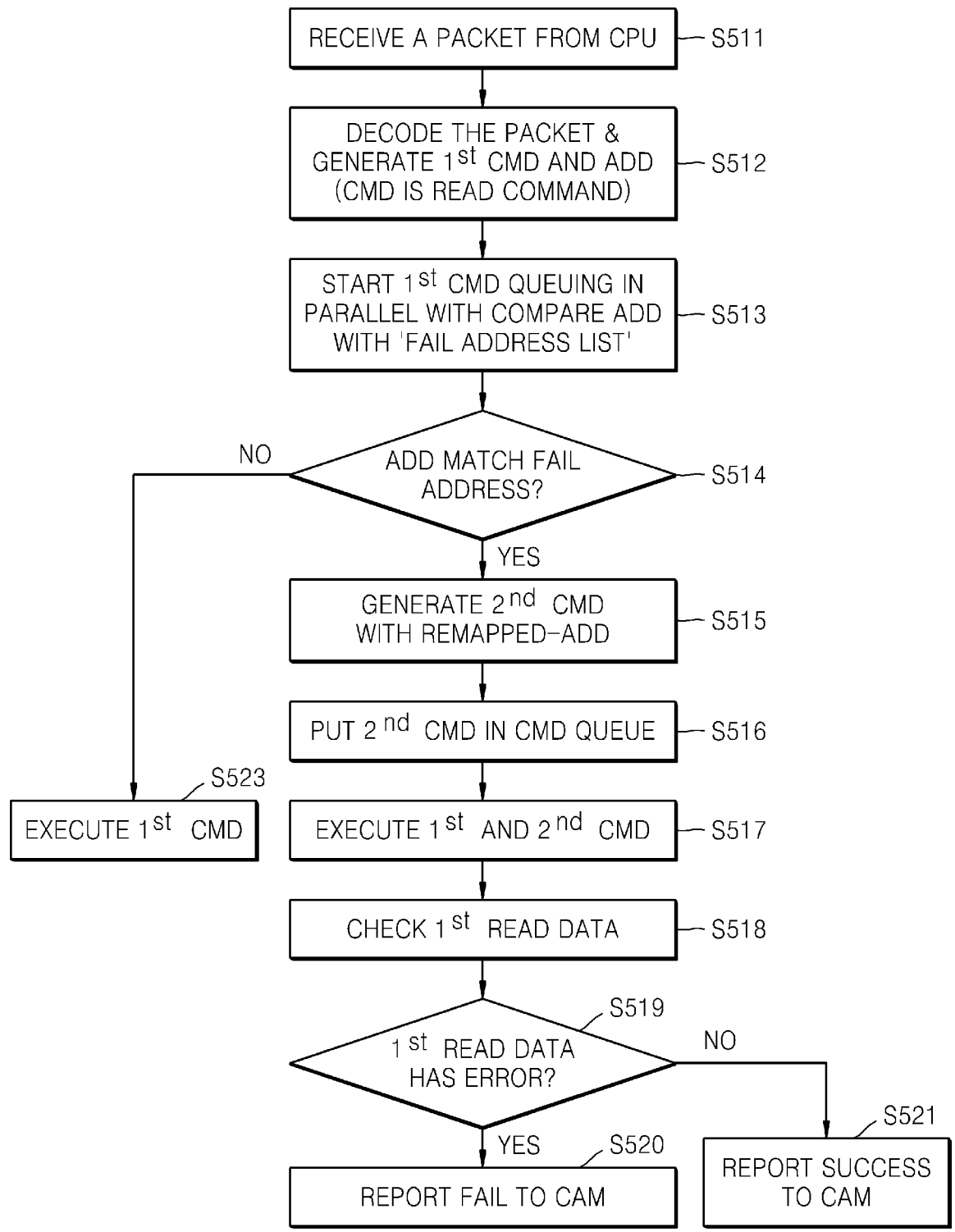
FIG. 12 is a flowchart of an operating method performed by a memory controller, according to another exemplary embodiment.

FIGS. 10 through 12 illustrate operating methods by the memory controller 3000, according to other exemplary embodiments. In the embodiment of FIGS. 10 through 12, while a data read operation is performed, a first address ADD that corresponds to a first command CMD may be detected as a fail address, so that a remapped second address and a second command that corresponds to the second address may be output. This may further include an operation of comparing first data that is received in response to the first command CMD with second data that is received in response to the second command, and then determining (or, determining and changing) a fail of the first address ADD.

FIG. 10 is a block diagram of a data blocking logic 3190A that is different from the data blocking logic 3190 of FIG. 6, according to one embodiment. Referring to FIGS. 6 and 10 (a), the data blocking logic 3190A may include a blocking circuit 3191A, an invalid data comparator 3192A, and a CAM controller 3193A. The blocking circuit 3191A receives a control signal BID from the arbiter 3160 and receives data RD that is read from the semiconductor memory device 1200. Here, when a first address ADD that corresponds to a first command CMD is detected as a defective cell, the CAM 3130 outputs a remapped second address ADD' and a second command CMD'. The blocking circuit 3191A controls whether or not to block the read data RD, in response to the control signal BID.

The invalid data comparator 3192A may compare first data that is received in response to the first command CMD with second data that is received in response to the second command CMD' and then may re-determine a fail of the first address ADD. When the first data and the second data do not match, the invalid data comparator 3192A determines that the first address ADD still corresponds to the fail address, and then provides the determination result to the CAM controller 3193A. The CAM controller 3193A may change information stored in the CAM 3130, based on the determination result. However, when the first data and the second data match, the invalid data comparator 3192A determines that the first address ADD no longer corresponds to the fail address and provides a determination result to the CAM controller 3193A.

The CAM controller 3193A may output a signal Ctrl_CAM to control the CAM 3130, based on the determination result. For example, when the first address ADD no longer corresponds to the fail address, the CAM controller 3193A may change fail address information stored in the CAM 3130. Accordingly, when a memory cell that corresponds to the first address ADD is accessed at a later time, the memory cell is determined as a normal cell.

Referring to FIGS. 6 and 10 (b), data blocking logic 3190B may include an error correction code (ECC) circuit 3191B and a CAM controller 3192B. The data blocking logic 3190B may detect and correct a bit error of input data by using the ECC circuit 3191B. Information that indicates an error correction possibility of read data RD from a defective cell that is accessed via a first address ADD may be provided to the CAM controller 3192B, and the CAM controller 3192B may output a signal Ctrl_CAM to control the CAM 3130 based on the information. For example, when an error of the read data RD can be corrected, the first address ADD may not be determined as a fail address, so that fail address information stored in the CAM 3130 may be changed. Also, a data blocking means (not shown) may be arranged inside or outside the ECC circuit 3191B, and according to a result of the error correction, the data blocking means may output the read data RD or may block an output of the read data RD.

FIG. 11 is a flowchart of an operating method performed by the memory controller 3000, according to another exemplary embodiment. The flowchart of FIG. 11 involves the operating method related to writing data.

Referring to FIGS. 6 and 11, the memory controller 3000 receives a packet, which includes information for accessing the semiconductor memory device 1200, from an external device such as a CPU (not shown) (operation S410). The packet decoder 3120 decodes the packet and then generates a first command CMD and a first address ADD that corresponds to the first command CMD (operation S420). Here, the first command CMD means a write command.

The CAM 3130 compares a match between the first address ADD and address information that is stored in the fail address list 3131. Here, an operation of detecting a fail of the first address ADD and an operation of queuing the first command CMD may be simultaneously performed, or the operation of detecting the fail of the first address ADD and an operation of outputting the first command CMD and the first address ADD may be simultaneously performed (operation S430).

The CAM 3130 detects whether the first address ADD is a fail address, according to a result of the comparison (operation S440). When the first address ADD is determined as an address that indicates a normal cell, the first command CMD and the first address ADD that queue in the CMD queue 3150 are executed and then are output to the semiconductor memory device 1200 (operation S441).

However, when the first address ADD is determined as an address that indicates a defective cell, a second address ADD' that is obtained by remapping the first address ADD and a second command CMD' that corresponds to the second address ADD' are generated (operation S450). Here, the first command CMD may be delivered to and temporarily stored in the CAM 3130 and then may be output as the second command CMD' to the CMD queue 3150.

The second command CMD' and the second address ADD' may be input to the CMD queue 3150 (operation S460). Then, each of the first command CMD and the second command CMD', which queue in the CMD queue 3150, is executed and then is output to the semiconductor memory device 1200 (operation S470).

FIG. 12 is a flowchart of an operating method performed by the memory controller 3000, according to another exemplary embodiment. The flowchart of FIG. 12 involves the operating method related to reading data.

Referring to FIGS. 6 and 12, the memory controller 3000 receives a packet, which includes information for accessing the semiconductor memory device 1200, from an external device such as a CPU (not shown) (operation S511). The packet decoder 3120 decodes the packet and then generates a first command CMD and a first address ADD that corresponds to the first command CMD (operation S512). Here, the first command CMD means a read command.

The CAM 3130 compares a match between the first address ADD and address information that is stored in the fail address list 3131. Here, an operation of detecting a fail of the first address ADD and an operation of queuing the first command CMD may be simultaneously performed, or the operation of detecting the fail of the first address ADD and an operation of outputting the first command CMD and the first address ADD to the semiconductor memory device 1200 may be simultaneously performed (operation S513).

The CAM 3130 detects whether the first address ADD is a fail address (operation S514). When the first address ADD is determined as an address that indicates a normal cell, the first command CMD and the first address ADD that queue in the CMD queue 3150 are executed and then are output to the semiconductor memory device 1200 (operation S523).

However, when the first address ADD is determined as an address that indicates a defective cell, a second address ADD' that is obtained by remapping the first address ADD and a second command CMD' that corresponds to the second address ADD' are generated (operation S515). Here, the first command CMD may be delivered to and temporarily stored in the CAM 3130 and then may be output as the second command CMD' to the CMD queue 3150.

The second command CMD' and the second address ADD' may be input to the CMD queue 3150 (operation S516). Then, each of the first command CMD and the second command CMD', which queue in the CMD queue 3150, is executed and then is output from the memory controller 3000 to the semiconductor memory device 1200 (operation S517).

The data blocking logic 3190 may compare first data that is received in response to the first command CMD with second data that is received in response to the second command CMD' and then may re-determine a fail of the first address ADD (operation S518). According to a match between the first data and the second data, the data blocking logic 3190 may determine whether data that is read via the first address ADD exists.

When the read data includes an error, the data blocking logic 3190 determines that the first address ADD corresponds to an address that still indicates the defective cell, and transmits a determination result signal reporting a fail so as to control the CAM 3130 (operation S520). On the other hand, when the read data does not include an error, the data blocking logic 3190 determines that the first address ADD no longer corresponds to an address that indicates the defective cell, and transmits a determination result signal reporting a success so as to control the CAM 3130 (operation S521). According to a result of the determination, the CAM 3130 may update fail address information.

According to the embodiments of FIGS. 6 through 12, since a fail address detecting device and a command/address queuing device are positioned in parallel on a main path for transmission of the commands and the addresses, a processing speed of the memory controller 3000 may be further increased, compared to a case in which a fail detecting operation and a queuing operation are sequentially performed.

For example, in a case where 1% of defective cells exist in the semiconductor memory device 1200, memory operations for 99% of addresses (or, the remaining 99% of cells) may have the same latency as that of the memory controller 3000 that does not support an operation of repairing the defective cells. In addition, by continually performing an access operation on addresses of the defective cells, it is possible to determine whether the defective cells are repaired.

Figure 13:
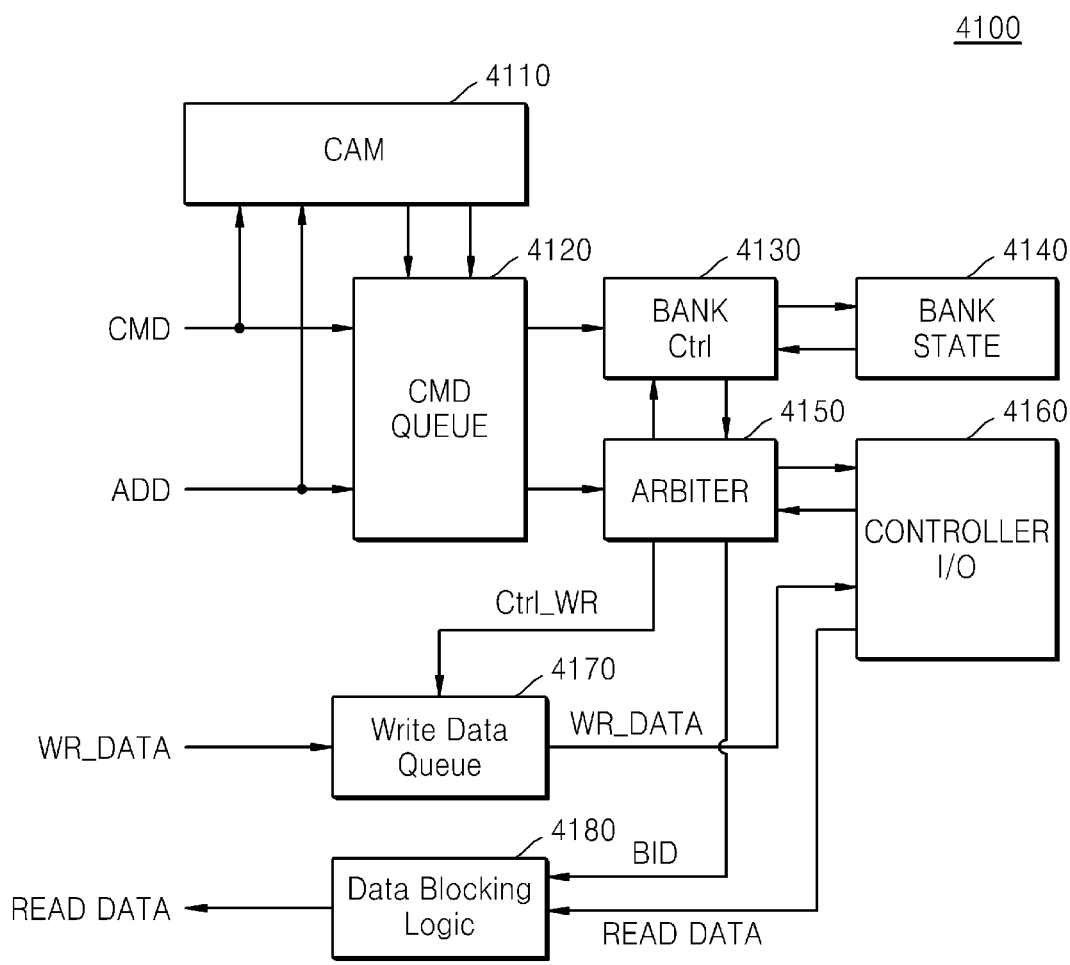
FIG. 13 is a block diagram of a memory controller, according to another exemplary embodiment.

FIG. 13 is a block diagram of a memory controller 4100, according to another exemplary embodiment. The memory controller 4100 may control a semiconductor memory device including a plurality of banks, and may include a CAM 4110, a CMD queue 4120, an arbiter 4150, and a controller I/O 4160 as in the previous embodiments, and the memory controller 4100 may further include a bank controller 4130 and a bank state storage unit 4140. Since command/address queuing operations and fail address detection operations by the memory controller 4100 are equally or similarly performed as in the previous embodiments, detailed descriptions thereof are omitted here.

An address ADD may include a bank address to select a plurality of banks of the semiconductor memory device. The bank controller 4130 may control a memory operation, based on the bank address. For example, when an access to a predetermined bank is requested, the bank controller 4130 determines a bank state of the semiconductor memory device by referring to information stored in the bank state storage unit 4140, and provides a result of the determination to the arbiter 4150. When the arbiter 4150 sets an execution priority order of a plurality of commands that are stored in the CMD queue 4120, the arbiter 4150 may set the execution priority order by using the result of the determination with respect to the bank state. In an embodiment, according to whether an access is continuously performed on the same bank or is continuously performed on different banks, a priority order in an output of the commands may vary.

Also, in another embodiment, the memory controller 4100 may further include a write data queue 4170 and a data blocking logic 4180. The write data queue 4170 outputs write data WR_DATA to the controller I/O 4160, in response to a write control signal Ctrl_WR from the arbiter 4150. Also, in a data read operation, the data blocking logic 4180 controls whether or not to block read data READ DATA, in response to a control signal BID from the arbiter 4150. In addition, it is obvious that the memory controller 4100 may further include other elements that are described above in the previous embodiments.

Figure 14:
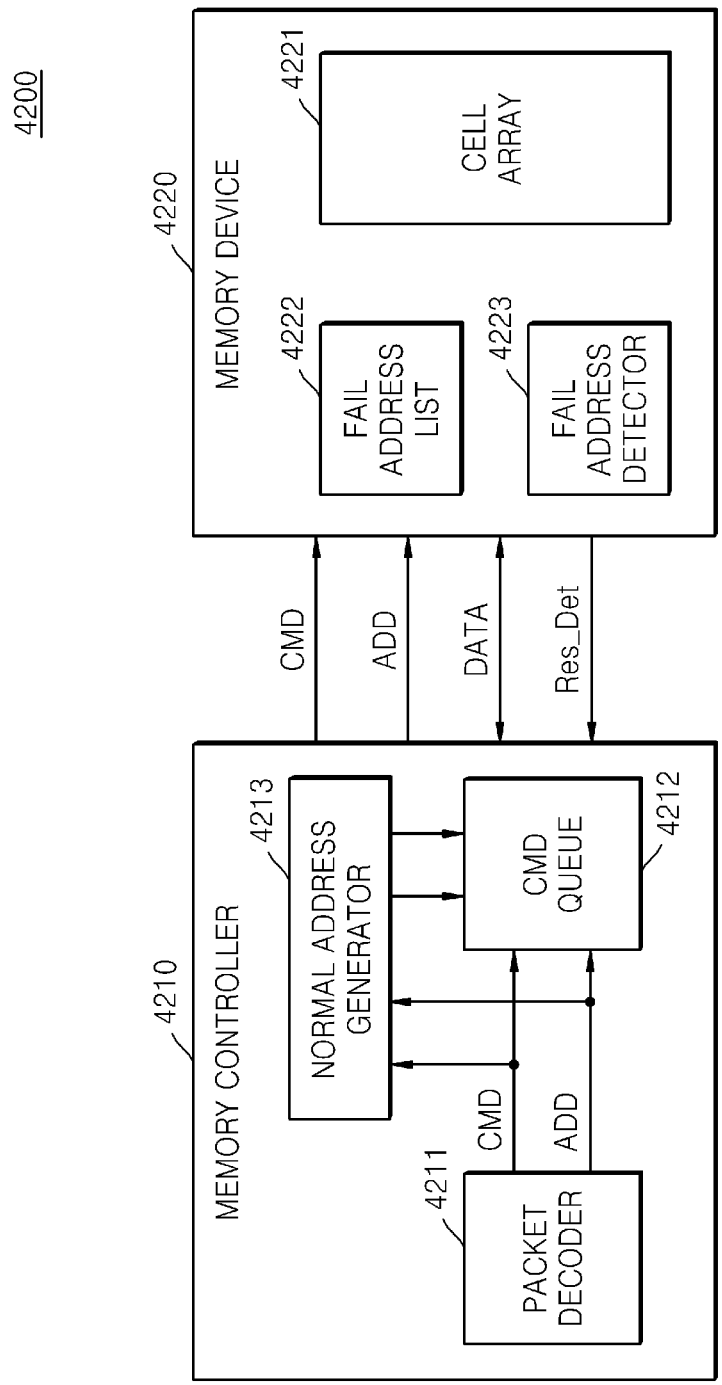
FIG. 14 is a block diagram of a memory system according to another exemplary embodiment.

FIG. 14 is a block diagram of a memory system 4200 according to another exemplary embodiment. In the embodiment of FIG. 14, a semiconductor memory device performs a portion of operations of storing fail address information and detecting a fail address. For example, a semiconductor memory device 4220 performs the operations of storing fail address information and detecting a fail address.

As illustrated in FIG. 14, the memory system 4200 includes a memory controller 4210 and the semiconductor memory device 4220. The memory controller 4210 may include a packet decoder 4211, a CMD queue 4212, and a normal address generator 4213. Also, the semiconductor memory device 4220 may include a cell array 4221, a fail address list 4222, and a fail address detector 4223.

Regardless of whether an access-requested address refers to a defective cell, the memory controller 4210 outputs a command CMD and an address ADD to the semiconductor memory device 4220. The fail address detector 4223 of the semiconductor memory device 4220 compares the address ADD with information stored in the fail address list 4222, and then detects an access with respect to a defective cell. As a result of the detection, when the request is related to an access with respect to a normal cell, the fail address detector 4223 writes data to a corresponding memory cell or outputs data that is read from the corresponding memory cell. On the other hand, when the request is related to the access with respect to the defective cell, the fail address detector 4223 outputs a determination signal Res_Det related to the request to the memory controller 4210.

The normal address generator 4213 may store address information related to the normal cell to replace the defective cell of the semiconductor memory device 4220. The normal address generator 4213 temporarily stores the command CMD and the address ADD, generates a normal address and a command that corresponds to the normal address, in response to the determination signal Res_Det, and provides them to the CMD queue 4212. The CMD queue 4212 additionally queues the normal address and the command that corresponds to the normal address, and provides the command CMD and the address ADD according to a queue order to the semiconductor memory device 4220, so that the CMD queue 4212 controls the normal cell to be accessed.

In the embodiment of FIG. 14, the semiconductor memory device 4220 performs the operations of storing fail address information and detecting a fail address. However, the present disclosure is not limited thereto. For example, the operation of detecting the fail address may be performed by the memory controller 4210, and fail address information that is stored in the semiconductor memory device 4220 may be provided to the memory controller 4210.

Figure 15:
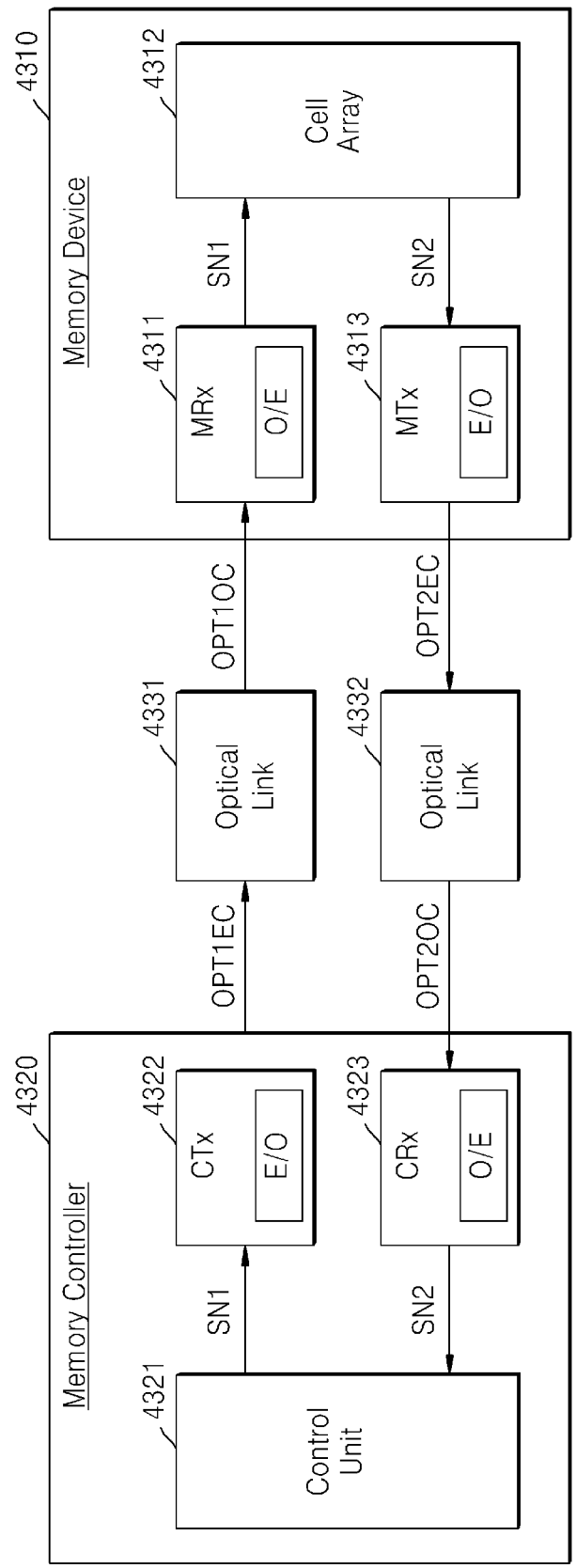
FIG. 15 is a block diagram of a memory system according to another exemplary embodiment.

FIG. 15 is a block diagram of a memory system 4300 according to another exemplary embodiment. Referring to FIG. 15, the memory system 4300 includes a memory controller 4320 and a semiconductor memory device 4310. The memory controller 4320 may perform a fail address detection operation and a queuing operation as in the previous embodiments.

Optical links 4331 and 4332 are connected between the memory controller 4320 and the semiconductor memory device 4310. The memory controller 4320 includes a control unit 4321, a first transmitter 4322, and a first receiver 4323. The control unit 4321 transmits a first electrical signal SN1 to the first receiver 4323. The first electrical signal SN1 may include a command, a clock signal, an address, data, or the like, which are transmitted to the semiconductor memory device 4220. According to the present embodiment, the first transmitter 4322 and the first receiver 4323 may be included in a controller I/O, and the control unit 4321 may include various elements related to generation of commands/addresses, or the like. For example, at least some of various elements including a packet decoder, a CAM, a CMD queue, or the like in the previous embodiments may be included in the control unit 4321.

The first transmitter 4322 includes an optical modulator E/O, and the optical modulator E/O converts the first electrical signal SN1 into a first optical transmission signal OTP1EC and then transmits the first optical transmission signal OTP1EC to the optical link 4331. The first optical transmission signal OTP1EC is transmitted in a serial communication manner via the optical link 4331. The first receiver 4323 includes an optical demodulator O/E, and the optical demodulator O/E converts a second optical reception signal OPT2OC from the optical link 4332 into a second electrical signal SN2, and then transmits the second electrical signal SN2 to the control unit 4321.

The semiconductor memory device 4310 includes a second receiver 4311, a cell array 4312, and a second transmitter 4313. The second receiver 4311 includes an optical demodulator O/E, and the optical demodulator O/E converts a first optical reception signal OPT1OC from the optical link 4331 into the first electrical signal SN1, and then transmits the first electrical signal SN1 to the cell array 4312.

In the cell array 4312, write data is written to a memory cell in response to the first electrical signal SN1, or data that is read from the cell array 4312 is transmitted as the second electrical signal SN2 to the second transmitter 4313. The second electrical signal SN2 may include a clock signal, the read data, or the like, which are transmitted to the memory controller 4320. The second transmitter 4313 includes an optical modulator E/O, and the optical modulator E/O converts the second electrical signal SN2 into a second optical transmission signal OTP2EC and transmits the second optical transmission signal OTP2EC to the optical link 4332. The second optical transmission signal OTP2EC is transmitted in a serial communication manner via the optical link 4332.

Figure 16:
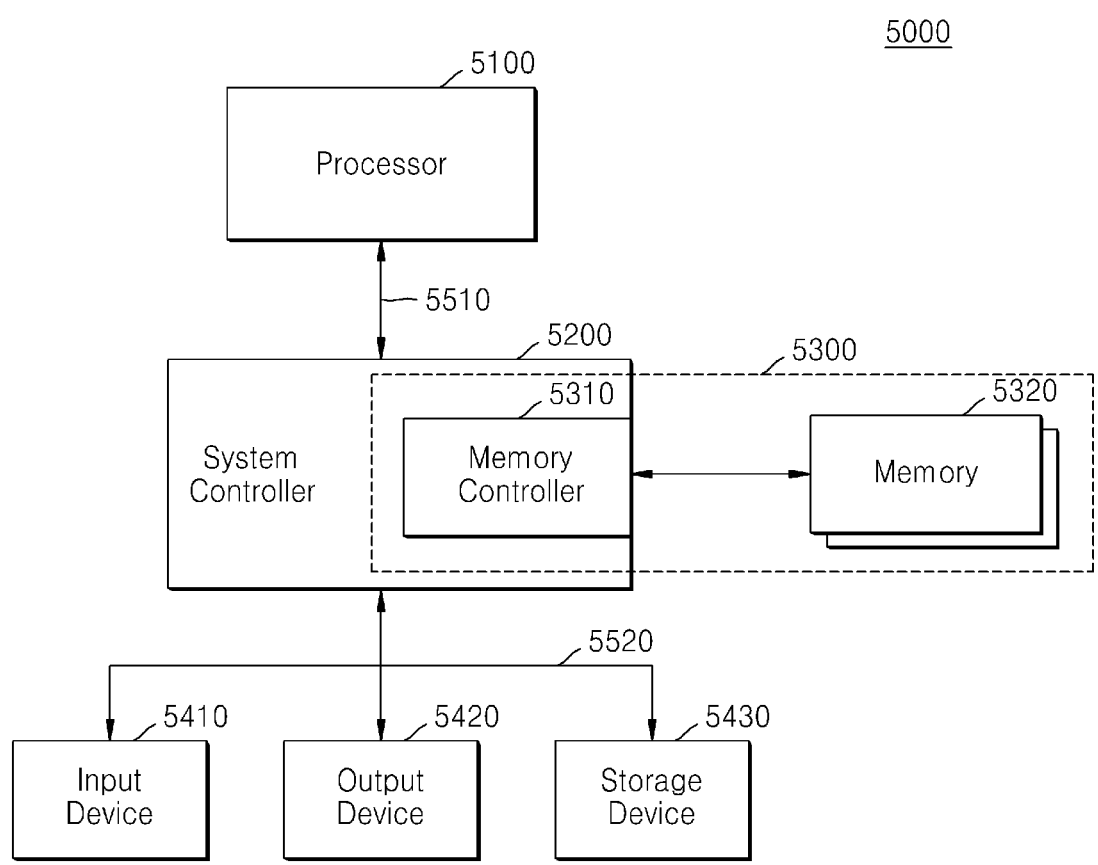
FIG. 16 is a block diagram of a computer system including a memory controller, according to an exemplary embodiment.

FIG. 16 is a block diagram of a computer system 5000 including a memory controller 5310, according to one exemplary embodiment. Referring to FIG. 16, the computer system 5000 includes a processor 5100, a system controller 5200, and a memory system 5300. The computer system 5000 may further include a processor bus 5510, an extension bus 5520, an input device 5410, an output device 5420, and a storage device 5430. The memory system 5300 may include at least one semiconductor memory device 5320, and a memory controller 5310. The memory controller 5310 may be included in the system controller 5200.

The processor 5100 may execute various computing systems by executing particular software for executing specific calculations or tasks. For example, the processor 5100 may be a microprocessor or a CPU.

The processor 5100 may be connected to the system controller 5200 via the processor bus 5510 including an address bus, a control bus and/or a data bus. The system controller 5200 is connected to the extension bus 5520 such as a peripheral component interconnection (PCI) bus. Accordingly, the processor 5100 may control the at least one input device 5410 such as a keyboard or a mouse, the at least one output device 5420 such as a printer or a display device, or the at least one storage device 5430 such as a hard disk drive (HDD), a solid-state drive (SDD) or a CD-ROM.

The memory controller 5310 according to the embodiment of FIG. 16 may control the semiconductor memory device 5320 to perform a command that is provided by the processor 5100. The semiconductor memory device 5320 may store data from the memory controller 5310 and may provide stored data to the memory controller 5310. The memory controller 5310 may include a CAM as in one of the previous embodiments_so as to repair a defective cell of the semiconductor memory device 5320.

The semiconductor memory device 5320 may include a plurality of memory chips such as a DRAM, a static random access memory (SRAM), or a non-volatile memory chip.

The computer system 5000 may include a desktop computer, a notebook computer, a work station, a hand health device, or the like.

Figure 17:
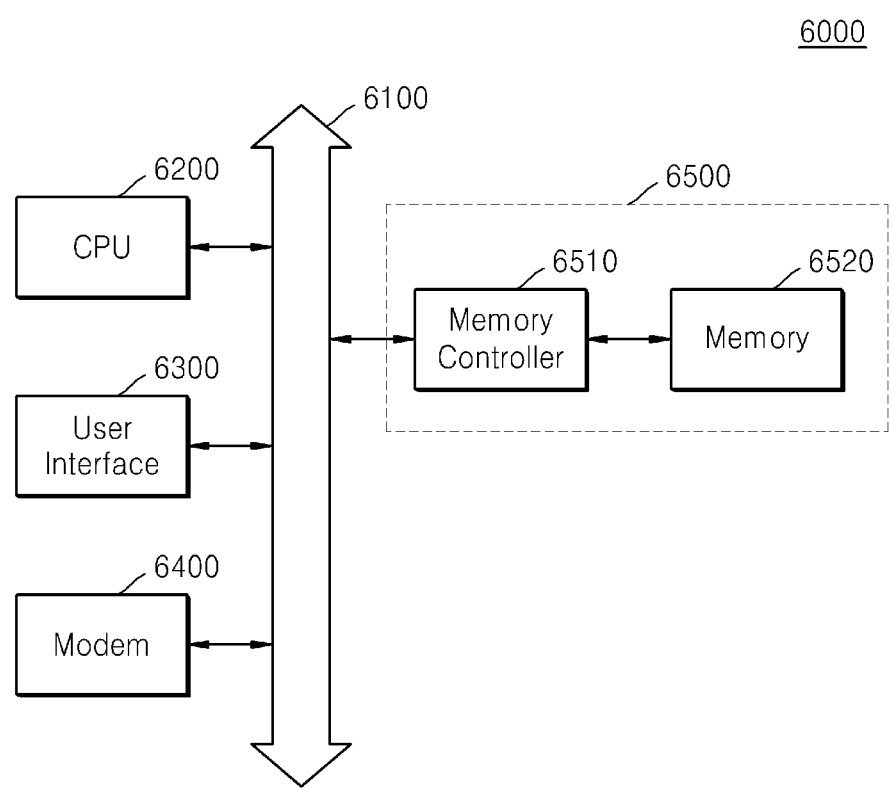
FIG. 17 is a block diagram of a computer system including a memory controller, according to another exemplary embodiment.

FIG. 17 is a block diagram of a computer system 6000 including a memory controller 6510, according to another exemplary embodiment. Referring to FIG. 17, the computer system 6000 may include a CPU 6200 that is electrically connected to a system bus 6100, a user interface 6300, a modem 6400, and a memory system 6500. A semiconductor memory device 6520 may include a volatile memory cell such as a DRAM cell or a non-volatile memory cell such as an STT-MRAM cell.

The memory system 6500 may include the semiconductor memory device 6520 and the memory controller 6510. The semiconductor memory device 6520 may store data that is processed by the CPU 6200 or may store data that is received from an external source. The memory controller 6510 may include a CAM as in one of the previous embodiments_so as to repair a defective cell of the semiconductor memory device 6520.

The semiconductor memory device 6520 may be used as storage to store a large amount of data that is requested by the computer system 6000 or as a main memory to store data such as system data that requires fast access. Although not illustrated in FIG. 17, the computer system 6000 may further include an application chipset, a camera image processor (CIS), an I/O device, or the like.

Figure 18A:
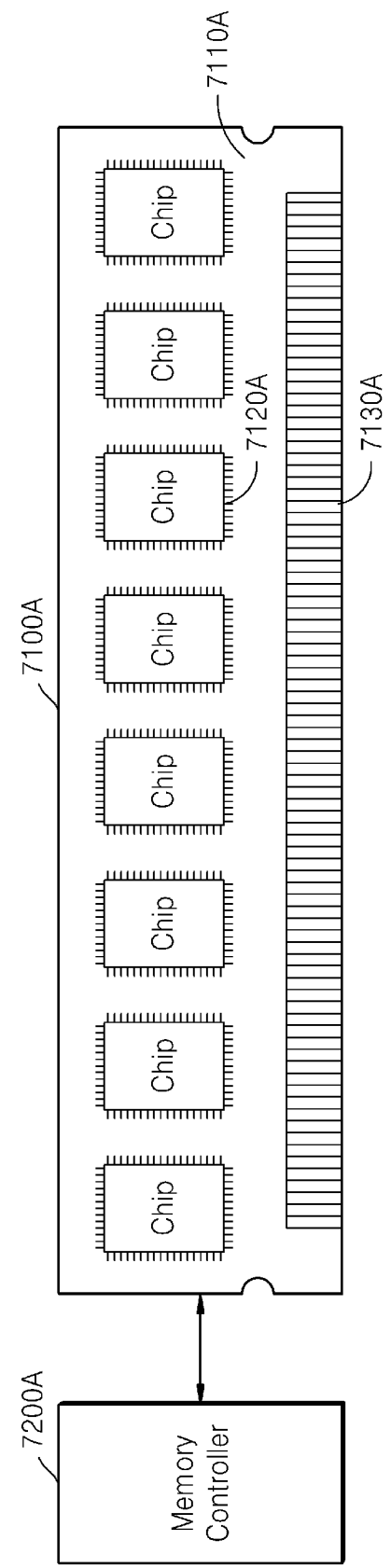
FIGS. 18A and 18B are block diagrams of memory controllers and memory modules, according to exemplary embodiments.
Figure 18B:
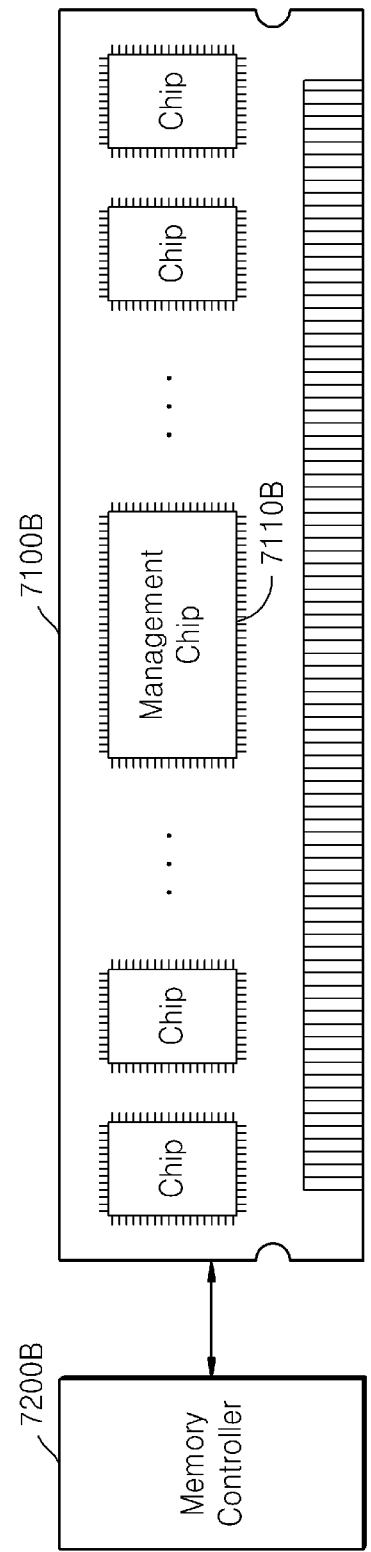

FIGS. 18A and 18B are block diagrams of memory controllers and memory modules, according to certain exemplary embodiments.

Referring to FIG. 18A, a memory system 7000A includes a memory module 7100A and a memory controller 7200A. The memory module 7100A includes a printed circuit module (PCM) 7110A, a plurality of memory chips 7120A, and a connector 7130A. The plurality of memory chips 7120A may be combined with top and bottom surfaces of the PCM 7110A. The connector 7130A is electrically connected to the plurality of memory chips 7120A via conductive lines (not shown). Also, the connector 7130A may be connected to a slot of an external host.

Each of the plurality of memory chips 7120A may include a volatile memory cell such as a DRAM cell or a non-volatile memory cell such as an STT-MRAM cell. Here, the plurality of memory chips 7120A may temporarily store data of a computer system such as an operating memory, a cache memory, or the like. The memory controller 7200A may simultaneously perform an operation of queuing or outputting a command and an operation of detecting a fail of an address that corresponds to the command. Also, in the memory system 7000A, a DRAM interface may be arranged between the memory controller 7200A and the memory module 7100A.

As illustrated in FIG. 18B, a memory system 7000B may include a memory module 7100B and a memory controller 7200B, and the memory module 7100B may include one or more semiconductor chips, each including a cell array, and a management chip 7110B to manage a memory operation with respect to the cell arrays. Some of the functions of the memory controller 7200B may be performed by the management chip 7110B, for example, the management chip 7110B may perform a fail address detection operation and a command queuing operation as in the one or more embodiments disclosed previously.

In the embodiment of FIG. 18B, some of the functions of the memory controller 7200B are performed by, but not limited thereto, a memory module in the form of an LRDIMM. For example, when a memory module in the form of an FBDIMM is used, an advanced memory buffer (AMB) chip as a management chip may be mounted in the memory module 7100B. Also, a memory module other than the aforementioned memory module may be used and may perform some of the functions of the memory controller 7200B.

Figure 19:
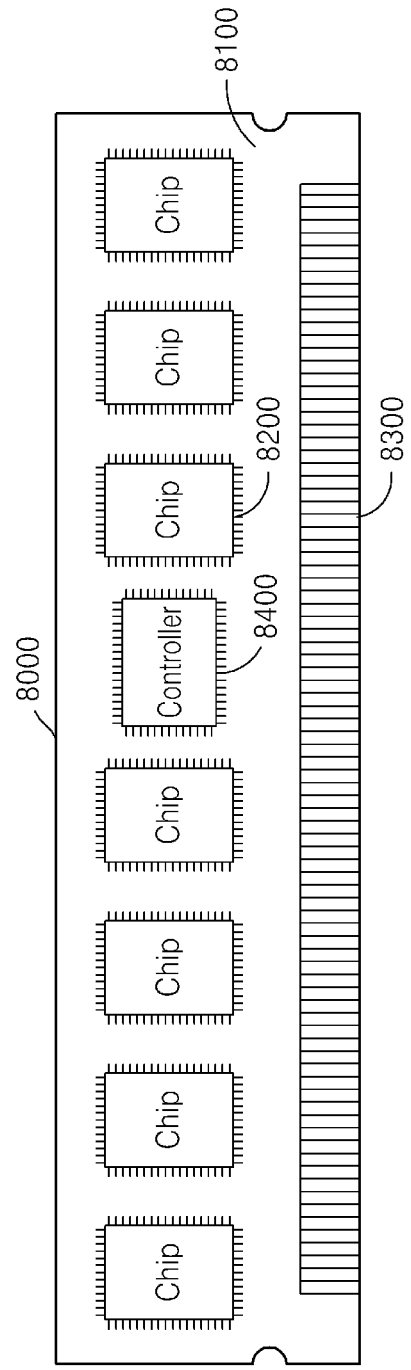
FIG. 19 is a block diagram of a memory module including a memory controller, according to an exemplary embodiment.

FIG. 19 is a block diagram of a memory module 8000 including a memory controller 8400, according to an exemplary embodiment.

Referring to FIG. 19, the memory module 8000 includes a PCM 8100, a plurality of memory chips 8200, a connector 8300, and a memory controller 8400. The plurality of memory chips 8200 may be arranged on top and bottom surfaces of the PCM 8100. The plurality of memory chips 8200 that are arranged on the top and bottom surfaces of the PCM 8100 may be connected to each other via a plurality of via holes. Each of the plurality of memory chips 8200 may include a volatile memory cell such as a DRAM cell or a non-volatile memory cell such as an STT-MRAM cell. Here, the plurality of memory chips 8200 such as an operating memory, a cache memory, or the like_may temporarily store data of a computer system.

The memory controller 8400 communicates with the plurality of memory chips 8200 and controls operational modes of the plurality of memory chips 8200. The memory controller 8400 may control various functions, characteristics, and modes by using a mode register of each of the plurality of memory chips 8200. Also, the memory controller 8400 may simultaneously perform an operation of queuing or outputting a command and an operation of detecting a fail of an address that corresponds to the command.

Figure 20:
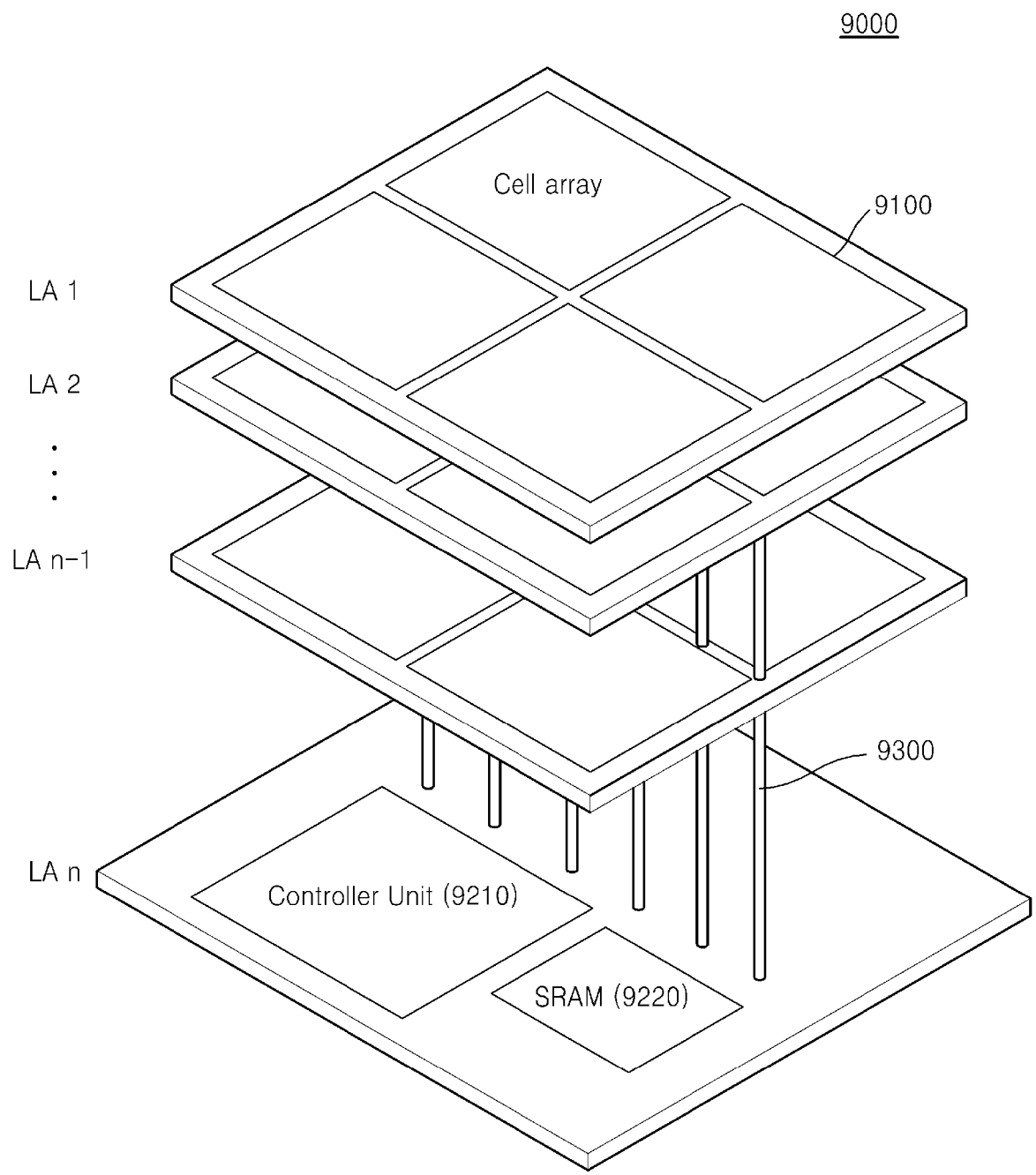
FIG. 20 is a block diagram of a semiconductor memory device with a stack structure including a plurality of semiconductor layers, according to an exemplary embodiment.

FIG. 20 is a block diagram of a semiconductor memory device 9000 with a stack structure including a plurality of semiconductor layers LA1 through LAn, according to one exemplary embodiment.

The semiconductor memory device 9000 may include the plurality of semiconductor layers LA1 through LAn. Each of the semiconductor layers LA1 through LAn may be a memory chip that includes cell arrays 9100 including memory cells. Alternatively, some of the semiconductor layers LA1 through LAn may be a memory chip, and others (or, at least one layer) of the semiconductor layers LA1 through LAn may be a controller chip that performs interfacing with the memory chip. In the embodiment of FIG. 20, it is assumed that the $n_{th}$ layer LAn is the controller chip.

Referring to FIG. 20, the controller chip LAn may include a controller unit 9210 to control the memory chip, and an SRAM 9220 to temporarily store various types of information related to memory operations. Here, the SRAM 9220 may be replaced with an embedded DRAM. Although the controller unit 9210 and the SRAM 9220 are separately formed in the embodiment of FIG. 20, the SRAM 9220 may be arranged in the controller unit 9210.

The controller unit 9210 communicates with memory chips LA1 through LAn−1 and controls operational modes of the memory chips LA1 through LAn−1. The controller unit 9210 may control various functions, characteristics, and modes by using a mode register of each of the memory chips LA1 through LAn−1. Also, the controller unit 9210 may simultaneously perform an operation of queuing or outputting a command and an operation of detecting a fail of an address that corresponds to the command. As described in the one or more embodiments, a defective cell included in the memory chips LA1 through LAn−1 may be replaced by using the SRAM 9220 that is arranged in the controller chip LAn.

The semiconductor layers LA1 through LAn in the stack structure of the semiconductor memory device 9000 may be connected to each other via through silicon vias (TSVs) 9300. Also, though not shown, one of more of the chips shown in FIG. 18 or 19 may be replaced by stack structures such as LAn through LAn−1 shown in FIG. 20.

According to the one or more embodiments, the memory controller may process a command queuing operation and a fail address defecting operation in parallel, so that the memory controller may increase its data processing speed while the memory controller performs a repair operation on a defective cell of the memory device.

While the present disclosure has been particularly shown and described with reference to exemplary embodiments thereof, it will be understood that various changes in form and details may be made therein without departing from the spirit and scope of the following claims.

What is claimed is:

1. An operating method performed by a memory controller, the operating method comprising:
   queuing a first command in a first queue;
   detecting a fail of a first address that corresponds to the first command;
   when the first address is determined as a fail address, queuing a second address and a second command in the first queue, wherein the second address is obtained by remapping the first address and the second command corresponds to the second address;
   outputting the second command and the second address from the first queue; and
   when the first command exists in the first queue, the queuing of the second command comprises replacing the first address and the first command with the second address and the second command, or the second address and the second command are queued in addition to the first address and the first command.

2. The operating method of claim 1, wherein, when the first address and the first command exist in the first queue, the first command and the first address are replaced in the first queue with the second address and the second command.

3. The operating method of claim 1, further comprising, when the first command is a read command, blocking an output of first data to an external source and outputting second data to the external source, wherein the first data is received in response to the first command and the second data is received in response to the second command.

4. The operating method of claim 3, further comprising determining whether the first address is a fail address by comparing the first data with the second data.

5. The operating method of claim 1, wherein, when the first command is a write command, the second command and the second address are output, regardless of whether the first command and the first address are output.

6. The operating method of claim 1, further comprising generating the first command and the first address by decoding a packet that is received from an external source.

7. The operating method of claim 1, wherein the memory controller comprises a storing unit that stores address information of a defective cell of a semiconductor memory device, and
   the detecting of the fail comprises comparing a match between the first address and the address information that is stored in the storing unit.

8. The operating method of claim 1, wherein the second address is generated so that an access time corresponding to the second command is less than an access time corresponding to the first command.

9. The operating method of claim 1, wherein the second command is controlled to be output from the first queue prior to other commands that are placed in the first queue before the second command.

10. The operating method of claim 1, wherein, when the first address is detected as a normal address, the first command and the first address are output according to a queuing order of the first queue.

11. The operating method of claim 1, wherein the first command is generated by decoding an external packet, and the second command requests a memory operation equal to a memory operation of the first command.

12. The operating method of claim 1, wherein the detecting of the fail occurs at a same time as the queuing of the first command or outputting the first command and the first address.

13. The operating method of claim 1, wherein the first address corresponds to an address in a normal memory area of a semiconductor memory device and the second address corresponds to an address in a redundancy memory area of the semiconductor memory device.

14. The operating method of claim 1, wherein the second address and the second command are queued in the first queue irrespective of a response from a memory device.

15. An operating method performed by a memory controller, the operating method comprising:
   queuing a first command in a first queue;
   detecting a fail of a first address that corresponds to the first command;
   when the first address is determined as a fail address, queuing a second address and a second command in the first queue, wherein the second address is obtained by remapping the first address and the second command corresponds to the second address; and
   outputting the second command and the second address from the first queue; wherein
   the memory control receives and temporarily stores the first command, and
   the temporarily stored first command is provided as the second command to the first queue.

16. The operating method of claim 15, wherein the memory controller comprises a content addressable memory (CAM) to perform the detecting.

17. A memory controller comprising:
   a decoder for decoding a packet and generating a command and an address that corresponds to the command;
   a first queue for storing the command and the address;
   a content addressable memory (CAM) for detecting a fail of a first address that corresponds to a first command, and when the first address is detected as a fail address, for outputting a second address and a second command to the first queue, wherein the second address is obtained by remapping the first address, and the second command corresponds to the second address; and
   a controller input/output (controller I/O) for outputting the command and the address stored in the first queue.

18. The memory controller of claim 17, wherein the decoder is connected to each of the first queue and the CAM, and the command and the address are provided in parallel to the first queue and the CAM.

19. The memory controller of claim 17, wherein the CAM comprises:
   a fail address storing unit for storing address information of a defective cell of a semiconductor memory device; and
   a fail address detector for the detecting the fail of the first address by comparing a match between the first address and the address information of the defective cell.

20. The memory controller of claim 19, wherein the fail address storing unit further stores remapping address information that corresponds to the address information of the defective cell, and
   the fail address detector outputs the remapping address information as the second address, wherein the remapping address information corresponds to the first address.

21. The memory controller of claim 17, wherein, when the first command exists in the first queue, the first address existing in the first queue is replaced with the second address.

22. The memory controller of claim 17, further comprising an arbiter that is disposed between the first queue and the controller I/O and that controls an execution of a command stored in the first queue.

23. The memory controller of claim 22, wherein, when the first command is a read command, the arbiter outputs an error data signal indicating that the first address corresponds to a fail address, and
   the memory controller further comprises data blocking logic for blocking an output of first data that is received in response to the first command and for controlling second data, which is received in response to the second command, to be output to an external source, according to the error data signal.

24. A method for a memory device, the method comprising:
   receiving a first command and a first address corresponding to the first command;
   determining whether the first address corresponds to a fail address and concurrently storing the first command and first address in a queue;
   when the first address corresponds to a fail address, storing a second address in the queue, the second address corresponding to the first address in the queue;
   when the first address does not correspond to a fail address, using the first address for the first command; and
   when the first address determined to correspond to the fail address before the first address is output from the queue, replacing the first address stored in the queue with the second address.

25. The method of claim 24, further comprising:
   if the first command is a write command:
      when the first address is determined to correspond to the fail address after the first address is output from the queue, outputting the second address from the queue along with a command that corresponds to the first command;
      when the first address is determined to correspond to the fail address before the first address is output from the queue, replacing the first address in the queue with the second address; and
   if the first command is a read command:
      when the first address is determined to correspond to the fail address after the first address is output from the queue, preventing a read operation for the first address; and
      when the first address is determined to correspond to the fail address before the first address is output from the queue, replacing the first address in the queue with the second address.

26. The method of claim 24, further comprising:
   storing a set of fail addresses, including the first address, in a table;
   subsequent to storing the second address in the queue or using the first address for the first command, determining whether the first address still corresponds to a fail address; and
   if the first address no longer corresponds to a fail address, removing the fail address from the table.

27. An operating method performed by a memory controller, the operating method comprising:
   queuing a first command in a first queue;
   detecting a fail of a first address that corresponds to the first command;

when the first address is determined as a fail address, queuing a second address and a second command in the first queue, wherein the second address is obtained by remapping the first address and the second command corresponds to the second address; and outputting the second command and the second address from the first queue, wherein, when the first command is a write command, the second command and the second address are output, regardless of whether the first command and the first address are output.

28. The operating method of claim 27, wherein, when the first command exists in the first queue, the queuing of the second command comprises replacing the first command and the first address with the second address and the second command.

29. The operating method of claim 27, further comprising, when the first command is a read command, blocking an output of first data to an external source and outputting second data to the external source, wherein the first data is received in response to the first command and the second data is received in response to the second command.

30. The operating method of claim 27, wherein the second address is generated so that an access time corresponding to the second command is less than an access time corresponding to the first command.

* * * * *